United States Patent
Safir

(10) Patent No.: US 11,619,423 B2
(45) Date of Patent: Apr. 4, 2023

(54) ALL-IN-ONE INTEGRATED MULTIFUNCTIONAL TRIPLE POWER MODULE

(71) Applicant: SAPHIRE SOLAR TECHNOLOGIES APS, Copenhagen (DK)

(72) Inventor: Yakov Safir, Copenhagen (DK)

(73) Assignee: SAPHIRE SOLAR TECHNOLOGIES APS, Copenhagen (DK)

(*) Notice: Subject to any disclaimer, the term of this patent is extended or adjusted under 35 U.S.C. 154(b) by 513 days.

(21) Appl. No.: 15/336,663

(22) Filed: Oct. 27, 2016

(65) Prior Publication Data

US 2017/0133974 A1    May 11, 2017

Related U.S. Application Data

(63) Continuation-in-part of application No. PCT/EP2016/069652, filed on Aug. 18, 2016.

(30) Foreign Application Priority Data

Aug. 18, 2015 (DK) .................. PA 2015 00482

(51) Int. Cl.
*H02S 20/22* (2014.01)
*H02S 40/42* (2014.01)
(Continued)

(52) U.S. Cl.
CPC ............. *F24S 20/69* (2018.05); *F24S 10/502* (2018.05); *F24S 10/75* (2018.05); *F24S 20/67* (2018.05); *F24S 25/61* (2018.05); *F24S 80/52* (2018.05); *F24S 80/65* (2018.05); *H01L 31/0203* (2013.01); *H01L 31/0443* (2014.12); *H01L 31/0525* (2013.01); *H01L 31/0547* (2014.12); *H01L 31/147* (2013.01); *H01L 31/18* (2013.01);
(Continued)

(58) Field of Classification Search
CPC ..... H01L 31/048–0488; H01L 31/0203; H02S 40/44; H02S 20/23–26; H02S 20/22; H02S 40/425; H02S 40/38; F24S 10/502; F24S 10/75
USPC .................................................. 136/243–265
See application file for complete search history.

(56) References Cited

U.S. PATENT DOCUMENTS 8,410,350 B2 * 4/2013 Corrales ............... H01L 31/052
136/246
2003/0015637 A1 * 1/2003 Liebendorfer .......... H02S 20/23
248/237
(Continued)

FOREIGN PATENT DOCUMENTS

WO    WO2010/057978    5/2010

OTHER PUBLICATIONS

English translation of Vernon, EP0981167 A2.*
(Continued)

*Primary Examiner* — Niki Bakhtiari
(74) *Attorney, Agent, or Firm* — KOS IP Law LLP

(57) ABSTRACT

A solar module includes a plurality of photovoltaic cells and a sandwich structure on which the plurality of photovoltaic cells is structurally supported. The sandwich structure includes top and bottom structural plates and an open-cell inner material located between the top and bottom structural plates.

20 Claims, 14 Drawing Sheets

(51) Int. Cl.
  *F24S 20/69* (2018.01)
  *H02S 40/38* (2014.01)
  *H02S 20/26* (2014.01)
  *H02S 20/23* (2014.01)
  *H02S 40/44* (2014.01)
  *F24S 80/65* (2018.01)
  *F24S 20/67* (2018.01)
  *F24S 10/75* (2018.01)
  *F24S 80/52* (2018.01)
  *F24S 25/61* (2018.01)
  *F24S 10/50* (2018.01)
  *H01L 31/054* (2014.01)
  *H01L 31/0443* (2014.01)
  *H01L 31/0203* (2014.01)
  *H01L 31/0525* (2014.01)
  *H01L 31/147* (2006.01)
  *H01L 31/18* (2006.01)

(52) U.S. Cl.
  CPC ............. *H02S 20/22* (2014.12); *H02S 20/23* (2014.12); *H02S 20/26* (2014.12); *H02S 40/38* (2014.12); *H02S 40/425* (2014.12); *H02S 40/44* (2014.12); *Y02B 10/10* (2013.01); *Y02B 10/20* (2013.01); *Y02B 10/70* (2013.01); *Y02E 10/44* (2013.01); *Y02E 10/47* (2013.01); *Y02E 10/60* (2013.01)

(56) References Cited

U.S. PATENT DOCUMENTS

| | | | | |
|---|---|---|---|---|
| 2005/0161074 | A1* | 7/2005 | Garvison | F24S 25/40 136/246 |
| 2007/0074755 | A1* | 4/2007 | Eberspacher | H01L 31/02008 136/244 |
| 2007/0277876 | A1* | 12/2007 | Huang | H01L 31/052 136/259 |
| 2009/0103165 | A1* | 4/2009 | Kothari | G02F 1/13306 359/290 |
| 2011/0005516 | A1* | 1/2011 | Xiang | H01L 31/048 126/704 |
| 2011/0209755 | A1* | 9/2011 | Zimmerman | C09K 19/38 136/257 |
| 2014/0261682 | A1* | 9/2014 | Sorloaica | H02S 40/425 136/259 |

OTHER PUBLICATIONS

"Solar Heating and Cooling in IEA Countries"; SHC Solar Update; vol. 46; Dec. 2006; Morse Associates, Inc.; Editor: Pamela Murphy; http://www.iea-shc.org/data/sites/1/publications/2006-12-SolarUpdate.pdf.

Morris, J. et al.; Presentation "Reducing Solar PV Soft Costs"; Rocky Mountains Institute; Dec. 2013; http://www.rmi.org/knowledge-center/library/2013-16_simpiebosrpt.

* cited by examiner

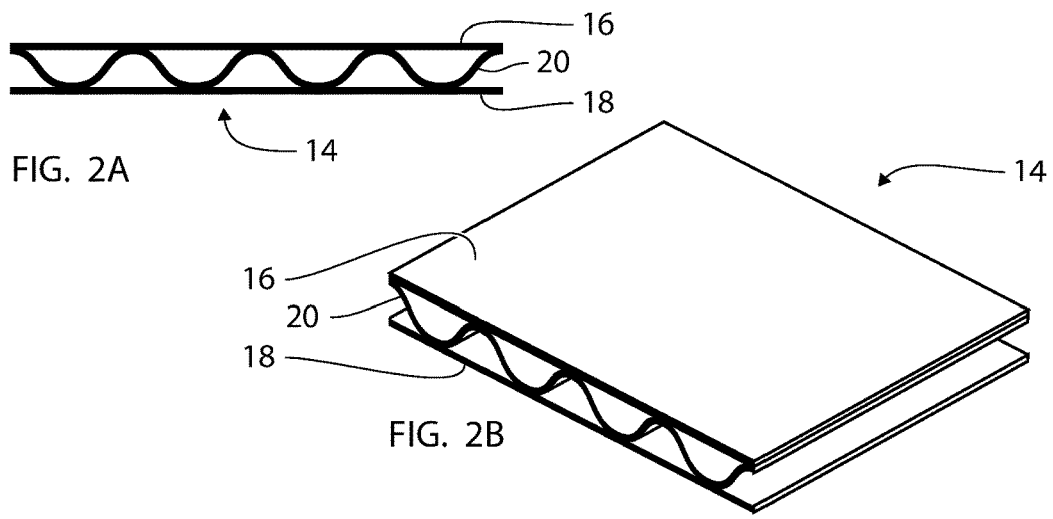
FIG. 2A
FIG. 2B
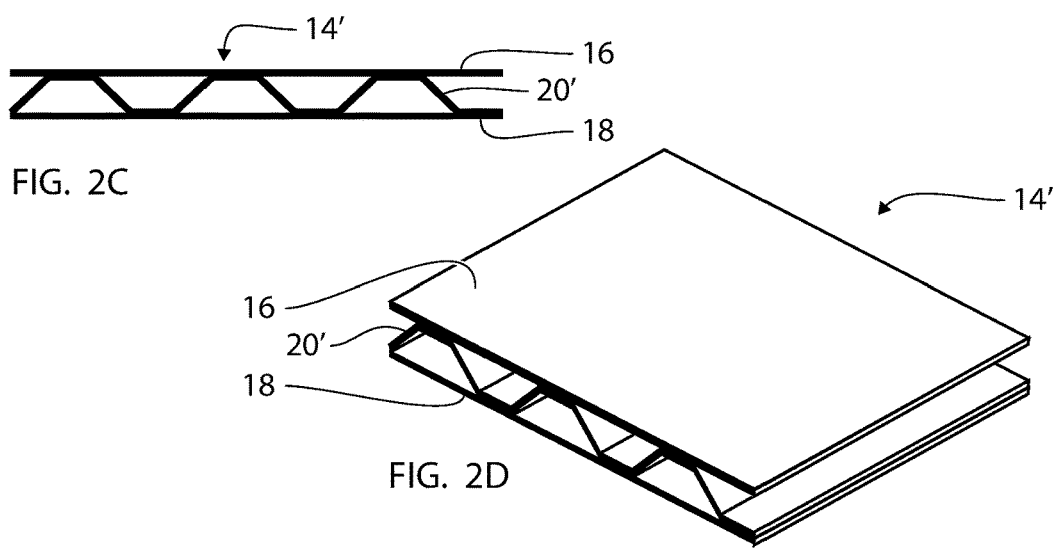
FIG. 2C
FIG. 2D
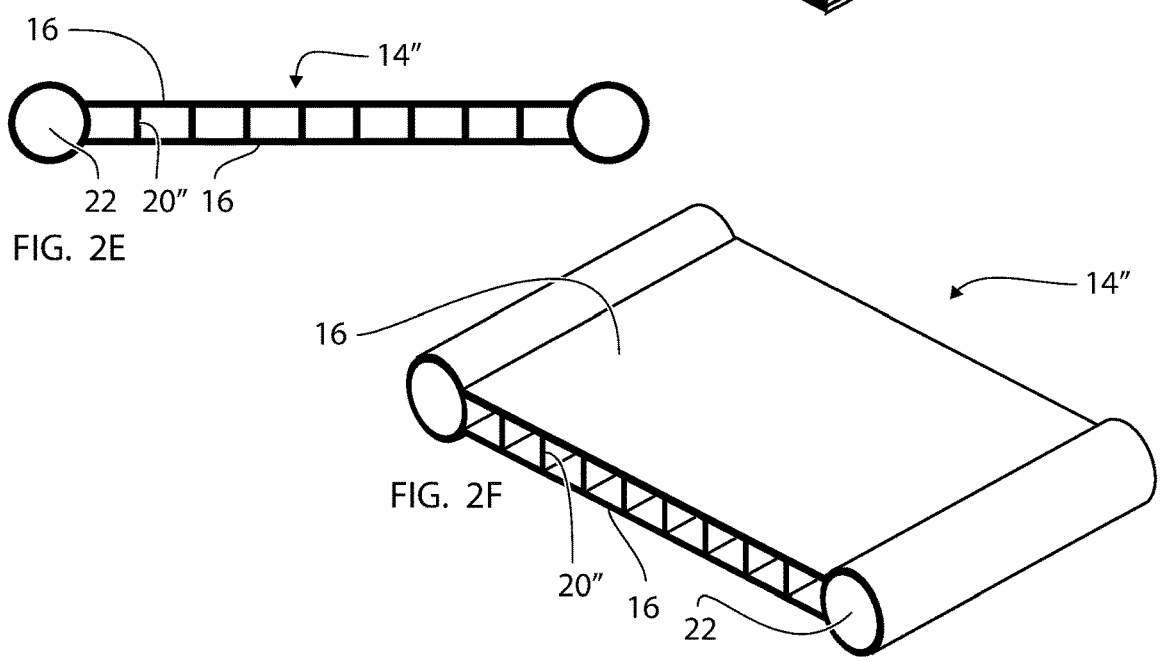
FIG. 2E
FIG. 2F

ALL-IN-ONE INTEGRATED MULTIFUNCTIONAL TRIPLE POWER MODULE

CROSS-REFERENCE TO RELATED APPLICATION

This application is a Continuation-in-Part of International Application No. PCT/EP2016/069652, filed Aug. 18, 2016, which claims priority from Danish Application No. PA 2015 00482, filed Aug. 18, 2015. The disclosures of both prior applications are incorporated by reference herein in their entireties.

BACKGROUND

The present disclosure relates to a method and a system for an All-in-one Integrated Multifunctional Triple Power Module, or "ITM."

Photovoltaic cells are well known in the art of energy production for generating electrical power from solar radiation in an environmentally friendly way. Such cells, when installed, require a minimum of maintenance and are therefore very suitable as a distributed source of energy. Photovoltaic cells are typically arranged in modules, which are placed in sunny locations. Popular locations include rooftops and facades of buildings.

Photovoltaic cells are made of semiconductor material and are very fragile. Thus, the solar module should provide a front plate and a back plate of rigid material for protecting the photovoltaic cells. The front plate should be transparent in order to allow solar radiation to reach the photovoltaic cells. The front plate is typically made of glass for providing a transparent and yet structurally stable front plate.

A problem encountered is that the solar modules tend to be quite heavy due to the glass used for the front surface. Thus, the number of solar modules which may be safely placed on the roof and/or façade of a building is limited by the structural capability of the building. In order to increase the effective surface and allow more solar modules to be installed, the building may have to be reinforced, or the solar modules may have to be carried by a separate framework, all of which increases the installation costs and reduces the aesthetic appearance of the installation. In some cases, the mounting costs alone amount to two-thirds of the total installation costs, in which the actual photovoltaic module amount to only one-third of the total installation cost. The decrease in prices for photovoltaic modules has made the mounting costs even more important for the future.

The applicant's own PCT application WO 2010/057978 discloses a high voltage semiconductor based wafer which may be mounted on the façade of a building.

Solar assemblies that combine photovoltaic panels and solar thermal collectors have been disclosed in the she solar update newsletter of December, 2006 (http://www.ieashc.org/data/sites/1/publications/2006-12-SolarUpdate.pdf).

The presentation "Reducing solar PV soft costs" of the Rocky Mountains Institute (available at http://www.rmi.org/knowledge-center/library/2013-16_simplebosrpt) discloses some opportunities for reducing the costs for solar module installation.

SUMMARY

The present disclosure relates to a PV or PVT solar module or solar panel or solar laminate (hereafter called "module") that is built by a double plate sandwich, metal structural plate or sandwich. The double plate sandwich ("DPS") provides constructional strength to the module so that it can be used with or without other supportive elements, such as a glass or aluminum frame.

The DPS can consist of a variety of metals or other materials with structural strength, such as glass, fiberglass, and composite or merged materials, in a variety of structural designs. Metals can be, e.g., aluminum, stainless steel, iron, copper, etc., as well mixtures or alloys of these metals. The design of the DPS can be 2 plates: a top plate and a bottom plate, not necessarily planar, but also curved. The two outer plates form a sandwich in which "the inner material" part may be, e.g., a sinusoidal-shaped corrugated plate, a trapezoidal-shaped corrugated plate, aluminum foam, metal foam, stainless steel foam, a honeycomb structured material, stone wool, silicon carbide, carbon, fiberglass, and/or composite or merged materials. Common for all these material designs is that the combination of the bottom plate and the inner material form a total structure of very high strength. Some structure types are shown in FIG. 1.

The material layers may be joined together by, e.g., glue, silicone, binders, or ethylene vinyl acetate ("EVA"). They can also be joined together by, e.g., soldering, welding, bonding, welding (e.g., by laser), ultrasonic bonding, and by other methods that bind the metal structures strongly together.

Another "DPS" sandwich type could be a combination of metal and plastic, or metal and glass, or plastic and glass, or metal, plastic, and glass. The DPS layers could also be a top plate, inner material, a middle plate, inner material, and a bottom plate. All such combinations in common have the potential of forming a structure that provides a physically strong module, wherein the term "strong" means solid and firm, so that the module, for example, will resist bending, braking, stretching, and deformation, and it can bear a load.

On the rear and the front of the DPS are laminated or encapsulated photovoltaic cells and/or a thermal absorber. The actual DPS can also consist of a thermal absorber structure.

Definitions and Possible Components of the Sandwich in the Present Invention "Interconnected Solar Cells" means an array of solar cells that are connected electrically together in strings, the cells or strings being interconnected via metal busbars and via bypass diodes. The bypass diodes are laminated in the same layer as the solar cells.

"The top front sheet" is defined as a sheet that is the outer front cover. It can have a plane or textured surface structure. It may consist of any a combination of the materials: metal (aluminum, steel, iron, copper, etc.), glass, stone wool, silicon carbide, carbon, and fiberglass. It could also consist of a DPS.

"The back rear sheet" is defined as a sheet that is the outer back cover. It can have a plane or textured surface structure. It may consist of any a combination of the materials: metal (aluminum, steel, iron, copper, etc.), glass, stone wool, silicon carbide, carbon and fiberglass The position of the DPS can vary for different PV or PVT module types. One type could consist of the following layers:

(1) A transparent top front sheet layer (made of glass, plastic or DPS), EVA layer, interconnected solar cells layer, EVA layer, DPS layer, EVA layer, plastic, glass or DPS layer.

Other PV or PVT types could be include the following layers:

(2) A transparent DPS top front sheet layer, EVA layer, interconnected solar cells layer, EVA layer, plastic, glass or DPS layer.

(3) A transparent top front (glass, plastic or DPS) sheet layer, EVA, interconnected solar cells layer, EVA layer, plastic layer, EVA layer, DPS layer, EVA layer, plastic layer or DPS.

(4) A transparent DPS top sheet, EVA, interconnected solar cells layer, EVA, plastic layer, EVA DPS, EVA, plastic layer.

In another aspect, the present disclosure relates to renewable energy modules, building elements, and constructions that enable the combination of several beneficial functions within the same physical area. The present disclosure of all-in-one integration of several functions into a single modular element/panel dramatically reduces the total system costs. The modular all-in-one element of the present disclosure is hereafter called "Hercules ITM," and it can consist of a DPS. The name "Hercules" refers to the fact that the construction is very strong. The term "ITM" refers to the modules according to the present disclosure being for an All-in-one Integrated Multifunctional Triple Power Module. This all-in-one single ITM element/module/panel is to be compared to standard modular elements/panels, which require several separately produced units in order to deliver and fulfill all the same functions and benefits. For standard state of the art units/panels, each function requires a separate mounting construction; each function requires a separate allocated area; each energy conversion requires a separate element/panel, e.g., for harvesting energy and converting it to electricity, and/or a separate element for converting solar light efficiently into heating energy, etc.

The size of one ITM unit can vary from a very small (e.g., 100 $cm^2$) for an indoor power generating module, to very large (e.g., 20 $m^2$) power modules. Several modules can be interconnected and thus form a system. As an example: If a building needs a 1000 $m^2$ roof, the ITM can provide an all-in-one lightweight roof element, e.g., an ITM unit that can be the actual roof building block. The roof will thus consist of 50 individual ITMs, each 20 $m^2$, and each ITM will include the integrated, built-in, all-in-one functions, including: architectural design, PV electrical generator, solar thermal absorber energy generator, night sky cooling energy generator, programmable Light Emitting Diodes, sensors, valves, insolation layer, battery storage, mounting fixing structure and hot/cold water storage.

Another example could be a 1000 $m^2$ façade, in which case the ITM could have the same multifunctional elements built-in, but instead of being a roof building element, the ITM becomes a wall or façade building element.

A third example could be a 20,000 $m^2$ ITM power plant, either ground-mounted or mounted on an existing roof. In this case, the main built in multifunctional features would be the high gains from the three built-in, all-in-on renewable energy generators, generating electrical energy and heat energy in the daytime and cooling energy during the night via black body sky radiation. All the before-mentioned multiple functions could also be included, although in this example the ITM element is not in itself a building integrated element but is adapted on the building or the ground.

In the present invention, the DPS and ITM can be mounted via a laminated metal or a hard material profile, hereafter called "Omega". The Omega has flaps and possible cross-sections as shown in FIG. 3, but it is not limited to this. Several Omegas can be fixed inside the DPS or ITM.

On the rear of the structure, the flaps are laminated or fixed inside the rear part of the module or DPS. This provides a very strong adhesion to the Omega. Thus after manufacturing of the module after the DPS or ITM has been produced with the Omega inside, the Omega can be screwed into or attached with other mounting elements, so that the module can be attached to facades or roofs or any building unit. The mounted attachment can be via rails, or it may be bolted, screwed, or welded into the façade.

Possible structure combinations are shown in FIGS. 4A, 4B, 4C, 4D, 4E, and 4F, but the present disclosure is not limited to these combinations.

An object of the present disclosure is thus to reduce the installation costs and improve the aesthetic appearance of the installation by maximizing the available surface for solar modules, while eliminating the need for a separate framework or reinforcing of the building. A further object of the present disclosure is to provide a solar module that provides both electrical and thermal energy.

An advantage of the solar module according to the present disclosure is that it may be used directly as a roof element and/or a façade element, thereby eliminating the need for facade panels and roof tiles, etc.

The above objects, together with numerous other objects, which are evident from the detailed description of the present invention, are obtained according to a first aspect of the present disclosure by a solar module comprising photovoltaic cells laminated in a sandwich structure, the sandwich structure providing structural strength to the solar module, the sandwich structure comprising a top plate and a bottom plate both being made of a material with structural strength, the sandwich structure further comprising an inner material located between the top plate and the bottom plate.

According to previous technologies, the solar module is attached onto the original roof and/or façade and thus contributes to the total weight of the façade and roof. The added weight of the solar module is typically not envisaged by the building design, and thus the building must be reinforced. The solar module according to the present disclosure, by contrast, is preferably mounted directly onto the load-bearing structure of the building, and is thus used as the actual roof tile and/or façade panel, thereby eliminating the need for separate façade panels and roof tiles.

In order to make the above feasible, the solar modules according to the present disclosure must have a weight per area unit that corresponds to the weight per area unit of conventional roof tiles, and the solar modules must be watertight themselves and arranged in a watertight relationship relative to each other.

The conventionally used solar module having a glass front that is load-bearing is therefore unsuitable, or at least very expensive, since it will be heavy and difficult to attach properly to the framework.

The presently suggested sandwich structure is advantageous, since it may be constructed to be very light in weight, while providing a high structural strength comparable to conventional façade panels and roof tiles. The top and bottom plates are typically made of a thin but solid and sturdy material of high density, such as aluminum, whereas the inner material constitutes a filler material interconnecting the top and bottom plates. The inner material has a lower density than the top and bottom plates and may preferably be a hollow structure, such as a honeycomb structure or a corrugated structure.

The photovoltaic cells are laminated in an isolated material such as EVA onto the top plate opposite the inner material. A cover, such as a plastic foil, is typically used for protecting the photovoltaic modules from wind, rain and debris.

In the presently suggested solar module, the sandwich structure, not the front plate, is structural and load-bearing. Thus, the sandwich structure may be fastened directly to the load-bearing framework of the building. As the sandwich structure is lightweight and may correspond to the weight of conventional façade panels and roof tiles, no reinforcement of the building structure is needed, and the entire façade and/or roof may, if desired, be covered by solar modules. The solar modules should be watertight and be sealed together in watertight joints, in order to provide a proper façade or roof surface.

According to a further embodiment of the first aspect, the top plate and the bottom plate may be made of metal such as aluminum, stainless steel, iron, or copper, and/or the inner material may be made in the form of cells interconnecting said top plate and said bottom plate, such as a corrugated metal core, a sinusoidal-shaped corrugated plate, a trapezoidal-shaped corrugated plate, aluminum foam, metal foam, stainless steel foam, a honeycomb structured material, stone wool, silicon carbide, carbon, or fiberglass. Preferably, one or more of the abovementioned lightweight materials are used.

According to a further embodiment of the first aspect, the photovoltaic cells are covered by or encapsulated in a transparent front cover made of a transparent film material or constituting a transparent sandwich structure providing thermal insulation for the solar module. Either a thin foil is used as a cover, or alternatively, a transparent sandwich structure made of, e.g., polymeric material. A transparent sandwich structure may on one hand provide additional structural strength to the solar module, similar to a glass cover, and it may also provide thermal insulation in order to make the thermal absorber more efficient, as a lot of thermal heat would escape though the front cover if it is non-isolated or non-insulated.

According to a further embodiment of the first aspect, the transparent front cover is textured, self-cleaning, anti-reflective, or nano-colored. A textured front cover may be used for allowing the cover to appear more like conventional roof tiles. The cover may be self-cleaning, e.g. by the use of compressed air for removing debris which otherwise would obscure one or more photovoltaic cells. Anti-reflective coating may be used for increasing the amount of radiation received by the photovoltaic cells, and nano-coloring may be used for allowing the solar modules to appear in a color different from the standard black color used conventionally.

According to a further embodiment of the first aspect, the solar module comprises bypass diodes laminated in the same layer as the photovoltaic cells. By the use of bypass diodes, any obscured or broken photovoltaic cell will be bypassed to prevent it from draining energy from the other cells. As the bypass diodes are laminated in the same layer as the photovoltaic cells, a compact unit is achieved. Further, in case, during installation, one or more photovoltaic cells are broken by being e.g. drilled through, the consequences are just that these cells are not contributing as they are bypassed; however, the other cells are still fully operable.

According to a further embodiment of the first aspect, the bottom plate comprises a hard material profile having flaps, which are laminated or fixed inside a rear part of the solar module. Using a hard metal profile will allow the solar module to be easily fixed to a building.

A further embodiment of the first aspect further comprises a wall mount in the form of a rail that is bolted to a load-bearing part of a building structure, and a connection piece bolted onto the hard material profile, and which includes a holding member for releasably holding the rail.

Preferably, six hard metal profiles and connection pieces are used per solar module, two at the top, two at the middle and two at the bottom, for a secure and releasable fixture of the solar module onto a wall of a building. Even more preferably, nine hard metal profiles and connection pieces are used per solar module, three at the top, three at the middle and three at the bottom, for an even more secure fixture of the solar module onto a wall of a building According to a further embodiment of the first aspect, the solar module comprises a thermal absorber, the thermal absorber being laminated onto the sandwich structure, encapsulated in the sandwich structure, welded onto the sandwich structure or forming an integrated part of the sandwich structure, the thermal absorber being thermally connected to a building heating system or building cooling system, optionally via a heat exchanger and/or a heat pump. Using a thermal absorber allows the solar module to provide thermal energy in addition to electric energy. The thermal absorber is preferably black in order to be able to absorb as much heat from the solar radiation as possible. The thermal absorber may also be used for providing night sky cooling by using the thermal absorber as a black body irradiator during night time when no solar irradiation exists. The thermal absorber may be thermally connected to the sandwich structure or form part of the sandwich structure. For instance, the space between the top plate and the bottom plate may be used for circulating a heating/cooling medium. The thermal absorber may preferably be made of aluminum.

Using the thermal absorber for providing building heating or cooling may involve circulating a heating/cooling medium, such as water, through the thermal absorber. The heating/cooling medium may in this way during daytime absorb thermal energy at the thermal absorber and release the thermal energy inside the building, e.g., by the use of a thermal convector. A heat exchanger and a heat storage tank may be used for, e.g., storing hot water for later domestic use or for heating during the night. The heat energy received from the thermal absorber may also be used for pre-heating water for the building central heating system, and/or in combination with a heat pump, for enhancing the efficiency of the system.

During night time, the process may be reversed, in that heat may be absorbed by indoor thermal convectors and released by black body radiation from the thermal absorber. Similarly, the cooling effect may be used later, e.g., during the daytime, by storing cool water for later use, and the effect may be enhanced by the use of a heat pump.

According to a further embodiment of the first aspect, the solar module comprises programmable Light Emitting Diodes (LEDs). The programmable LEDs preferably comprise a set of red-green-blue (RGB) diodes, each representing one pixel, and together being capable of displaying text messages or images over the whole surface of the solar module.

The solar modules may also be used as environmentally and energy effective big screens by incorporating RGB diodes into the module. During daytime, the solar module may be used for charging a battery with electric energy. The RGB diodes, positioned between the photovoltaic cells, may be powered by the battery and controlled by a computer to light up in different colors, forming images or text messages similar to a big LCD screen.

According to a further embodiment of the first aspect, the solar module comprises an insulation layer. The insulation layer may be located on the front side of the solar module, provided it is transparent. It may also form part of the sandwich structure, e.g., be part of the inner material of the sandwich. The insulation may also be located at the rear side of the solar module, or a combination of the above. The insulation reduces thermal losses and improves the efficiency of any thermal absorbers that may be used.

According to a further embodiment of the first aspect, the sandwich structure comprises an intermediate plate being made of a material with structural strength and located within the inner material between the top plate and a bottom plate. In this way a dual sandwich structure is achieved. In addition, to provide further structural strength to the solar module, the different layers thereby achieved may be used for different purposes. For instance, the space between the top plate and the intermediate plate may be used for the thermal absorber by circulating the heating/cooling medium therein, whereas the space between the bottom plate and the intermediate plate may be used for thermal insulation.

According to a further embodiment of the first aspect, the top plate and the bottom plate are staggered, such that a plurality of solar modules may be connected in a partially overlapping configuration. In this way, the solar modules may be interconnected in a likewise staggered configuration in a roof or façade structure in which the top portion of a higher situated module overlaps the bottom portion of a lower situated solar module. In this way, rainwater running along the outer surface of the solar module will not be able to leak inside into the load-bearing structure of the building.

The above object together with numerous other objects which are evident from the detailed description below are obtained according to a second aspect of the present invention by a building structure having solar modules mounted directly onto the load-bearing structure of the building structure as façade or roof elements, the solar modules being mutually interconnected to form a waterproof surface.

The above solar modules according to the first aspect are preferably mounted close together to form a unitary and watertight surface on a facade or roof of a building.

The above object together with numerous other objects which are evident from the detailed description below are obtained according to a third aspect of the present disclosure by a method of manufacturing a solar module, the method comprising providing a top plate and a bottom plate both being made of a material with structural strength, locating an inner material between the top plate and the bottom plate, laminating solar cells and optionally bypass diodes onto the top plate, and preferably covering the solar cells and bypass diodes by a transparent front cover, The method according to the third aspect is preferably used for manufacturing the solar modules according to the first aspect.

According to a further embodiment, the solar module further comprises at least one battery thermally contacting the sandwich structure opposite the photovoltaic cells. In this way, the battery or batteries may be integrated into the solar module and at the same time be cooled by the same technique as used for cooling the photovoltaic cells, i.e., during the day by circulating a cooling/heating fluid through the sandwich structure, and during the night using night sky cooling. Each battery is preferable made flat in order to save space, and it is releasable from the rest of the module in order to be replaceable with a fresh battery.

The above object together with numerous other objects which are evident from the detailed description below are obtained according to a fourth aspect of the present disclosure by a solar module comprising photovoltaic cells laminated on a thermal absorbing structure, further comprising at least one battery thermally contacting the thermal absorbing structure opposite the photovoltaic cells. In this way, an alternative embodiment is realized having a thermal absorber in which photovoltaic cells are laminated on one side and a battery or batteries are thermally contacting the opposite side. Thus, the thermal absorber may be used for cooling both the photovoltaic cells and the battery or batteries.

BRIEF DESCRIPTION OF THE DRAWINGS

FIG. 2A is a side view of a sandwich structure having a sinusoidal-shaped corrugated interior.

FIG. 2B is a perspective view of the sandwich structure having a sinusoidal-shaped corrugated interior.

FIG. 2C is a side view of a sandwich structure having a trapezoid-shaped corrugated interior.

FIG. 2D is a perspective view of the sandwich structure having a trapezoid-shaped corrugated interior.

FIG. 2E is a side view of a sandwich structure having a rectangular-shaped open-cell interior.

FIG. 2F is a perspective view of the sandwich structure having a rectangular-shaped open-cell interior.

DETAILED DESCRIPTION

Figure 1A:
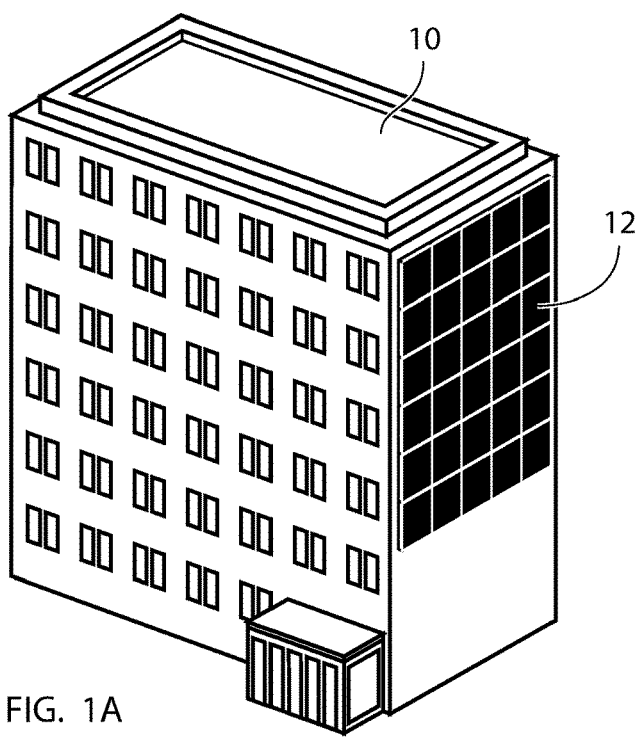
FIG. 1A is a perspective view of a building having façade-mounted solar modules, depicted during daytime.

FIG. 1A shows a perspective view of a building 10 having façade-mounted solar modules 12. During the day, the solar modules 12 generate electrical energy, which may be stored in battery modules (not shown) or fed to the grid. Additionally, the solar modules 12 may produce thermal energy, which may be used directly for domestic heating purposes or stored for later use in the building.

Figure 1B:
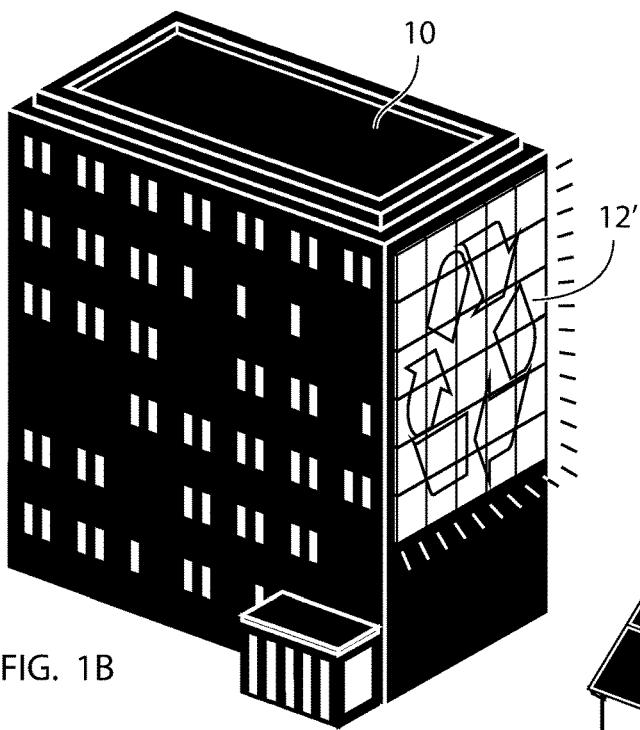
FIG. 1B is a perspective view of a building having façade-mounted solar modules, depicted during night time.

FIG. 1B shows the building 10 of FIG. 1A at night time, having façade-mounted solar modules 12'. The solar modules 12' may have integrated LEDs, which may form a big screen for displaying images or texts. Further, during the night, the solar modules may be used for night sky cooling of the building 10.

Figure 1C:
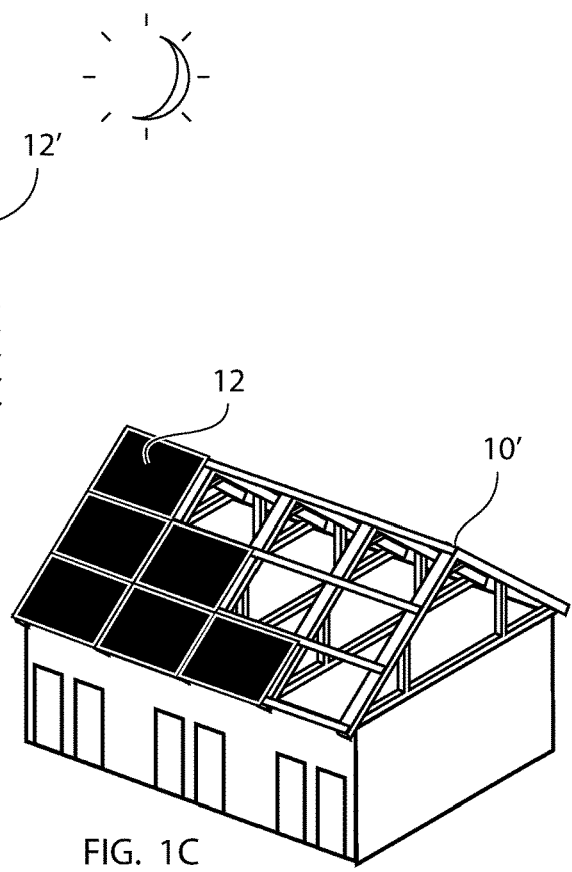
FIG. 1C is a perspective view of a building having roof-mounted solar modules.

FIG. 1C shows a perspective view of a building 10' having roof-mounted solar panels 12. The panels are mounted onto the load-bearing structure of the building, in place of roof tiles.

FIGS. 2A and 2B show a sandwich structure 14. The sandwich structure comprises a top plate 16 and a bottom plate 18 made of a material having a structural strength, preferably aluminum. The sandwich structure 14 has a sinusoidal-shaped corrugated interior 20 interconnecting the top plate 16 and the bottom plate 18 in order to form a cell structure, which provides structural strength for the sandwich structure 14. The corrugated interior 20 may be made of aluminium, preferably extruded aluminum.

FIGS. 2C and 2D show a sandwich structure 14' having a trapezoidal-shaped corrugated interior 20' similar to the previous embodiment.

FIGS. 2E and 2F show a sandwich structure 14" having a rectangular-shaped open cell interior 20" similar to the previous embodiments, and additionally being provided with pipes 22 for circulating cooling or heating fluids, such as water and/or glycol.

Figure 3A:
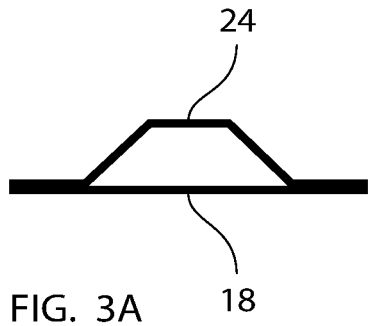
FIG. 3A is a side view of a solar module with a metal profile having a trapezoid shape.
Figure 3B:
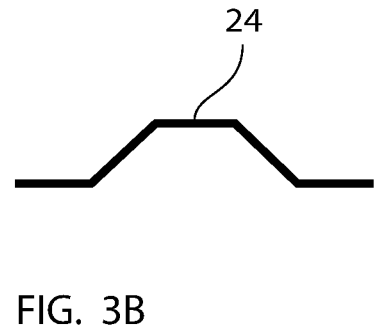
FIG. 3B is a side view of a metal profile having a trapezoid shape.

FIG. 3A shows a side view of a solar module with a metal profile 24 having a trapezoid shape. The metal profile 24 has flaps that are laminated or welded onto the bottom plate 18 of the sandwich structure, thereby providing a suitable fastening mechanism for the solar module. The metal profile is preferably made of a hard and durable metal. FIG. 3B shows a side view of the metal profile 24 having a trapezoid shape, without the bottom plate of the sandwich structure.

Figure 3C:
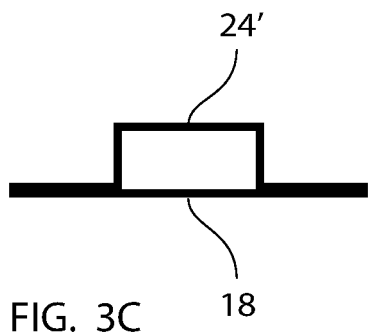
FIG. 3C is a side view of a solar module with a metal profile having a rectangular shape.
Figure 3D:
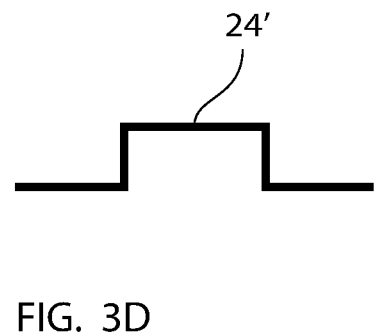
FIG. 3D is a side view of a metal profile having a rectangular shape.

FIG. 3C shows a side view of a solar module with a metal profile 24' having a rectangular shape, which, as in the previous embodiment, includes flaps attached to a bottom plate 18. FIG. 3D shows a side view of the metal profile 24' having a rectangular shape, without the bottom plate of the sandwich structure.

Figure 3E:
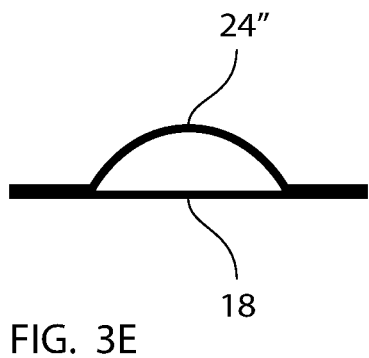
FIG. 3E is a side view of a solar module with a metal profile having an "omega" shape.
Figure 3F:
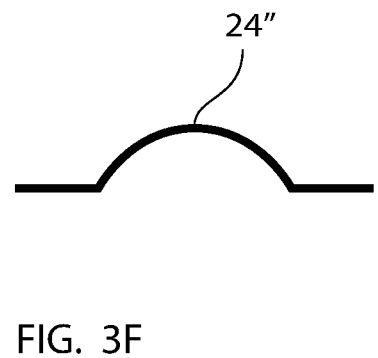
FIG. 3F is a side view of a metal profile having an "omega" shape.

FIG. 3E shows a side view of a solar module with a metal profile 24" having an arcuate or "omega" shape, which, as in the previous embodiment, includes flaps attached to a bottom plate 18. FIG. 3F shows a side view of the metal profile 24" having an arcuate or "omega" shape, without the bottom plate of the sandwich structure.

Figure 4A:
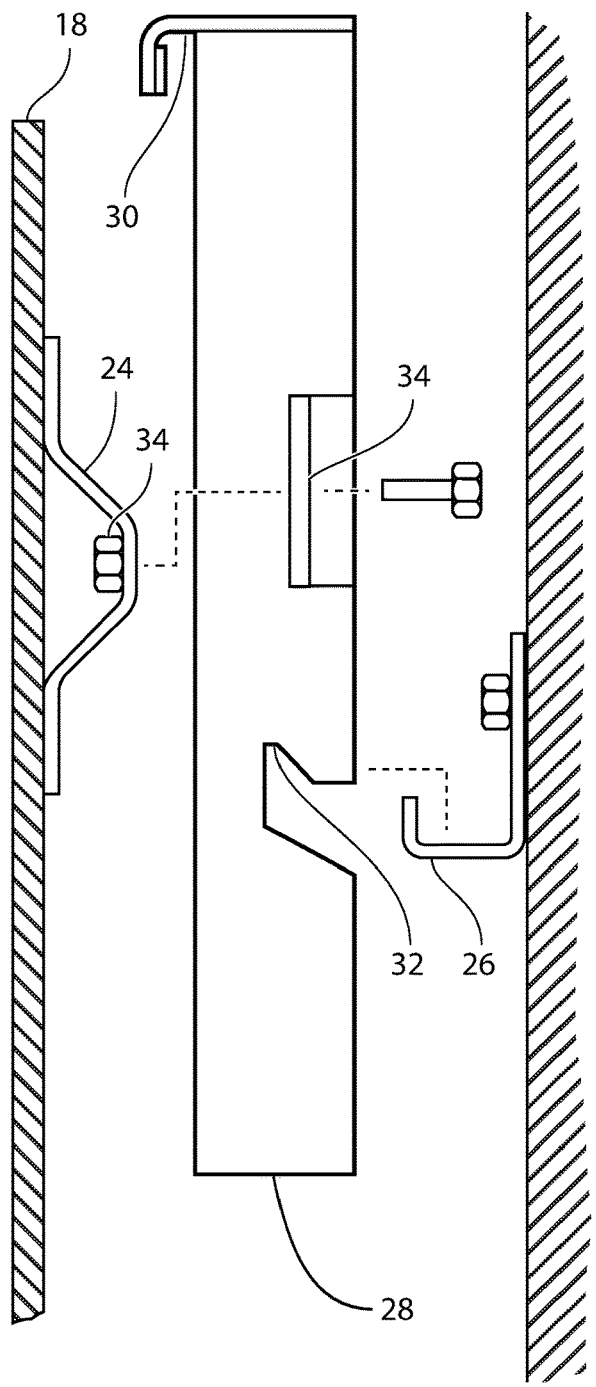
FIG. 4A is an exploded side view of an upper mounting system for a solar module.
Figure 4B:
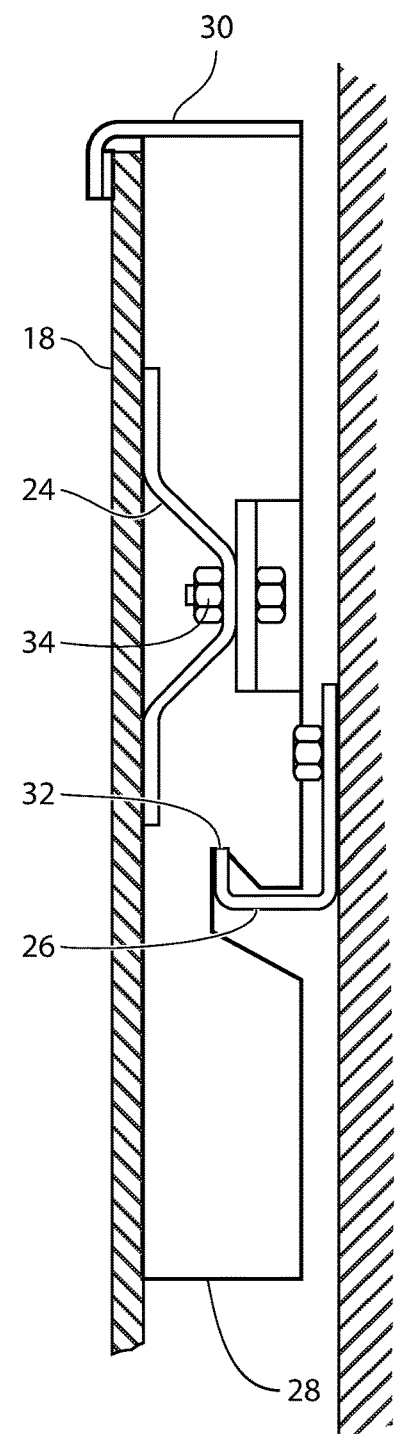
FIG. 4B is a side view of the upper mounting system of FIG. 4A when mounted.

FIG. 4A is an exploded side view of an upper mounting system for a solar module. The mount for a complete solar module preferably comprises a total of nine mounting systems, three upper, three middle and three lower. The mounting system 28 comprises a metal profile 24 as described above, which is welded or laminated onto the bottom plate 18 of the sandwich of the solar module. A rail 26 is fastened to the wall of the building, e.g, by one or more screws or bolts. A connecting member 28 is used for interconnecting the metal profile 24 and the rail 26. The connecting member 28 comprises a frame 30, which forms the top part of an outer frame of the module. The connecting member 28 further comprises a holding part 32, which catches the rail 26. The metal profile 24 is fixed to the connecting member 28 via a screw mount 34. FIG. 4B shows a side view of the upper mounting system when mounted on the wall of a building.

Figure 4C:
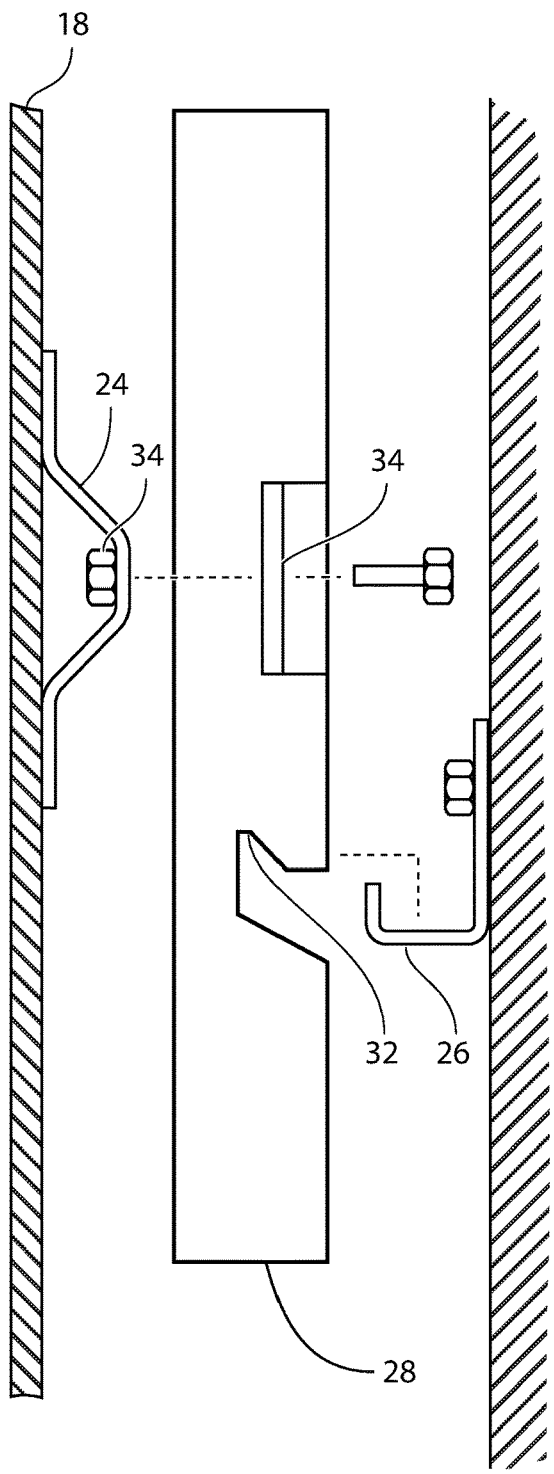
FIG. 4C is an exploded side view of a middle mounting system for a solar module.
Figure 4D:
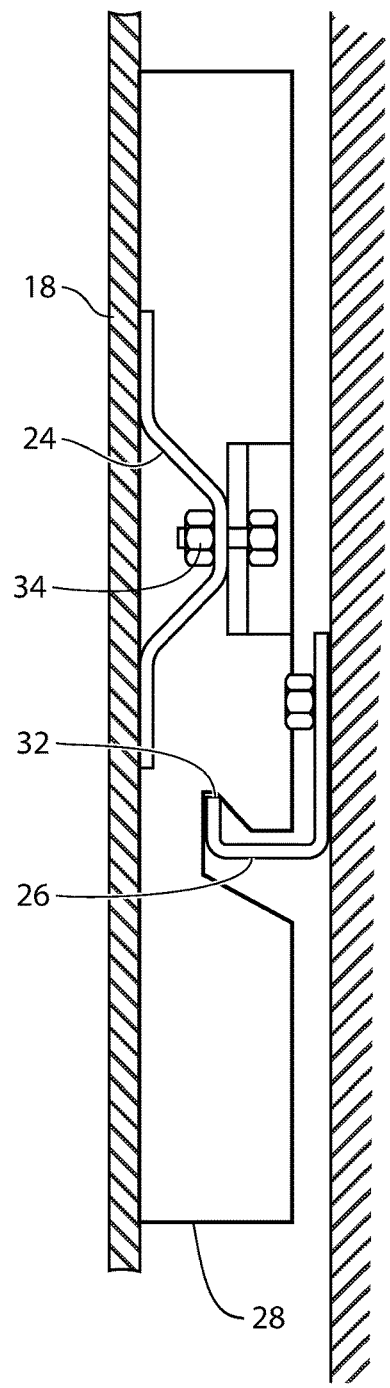
FIG. 4D is a side view of the middle mounting system of FIG. 4C when mounted.

FIG. 4C is an exploded side view of a middle mounting system for a solar module. The middle mounting system may advantageously be similar in construction to the above-described upper mounting system. FIG. 4D shows a side view of the middle mounting system when mounted on the wall of a building.

Figure 4E:
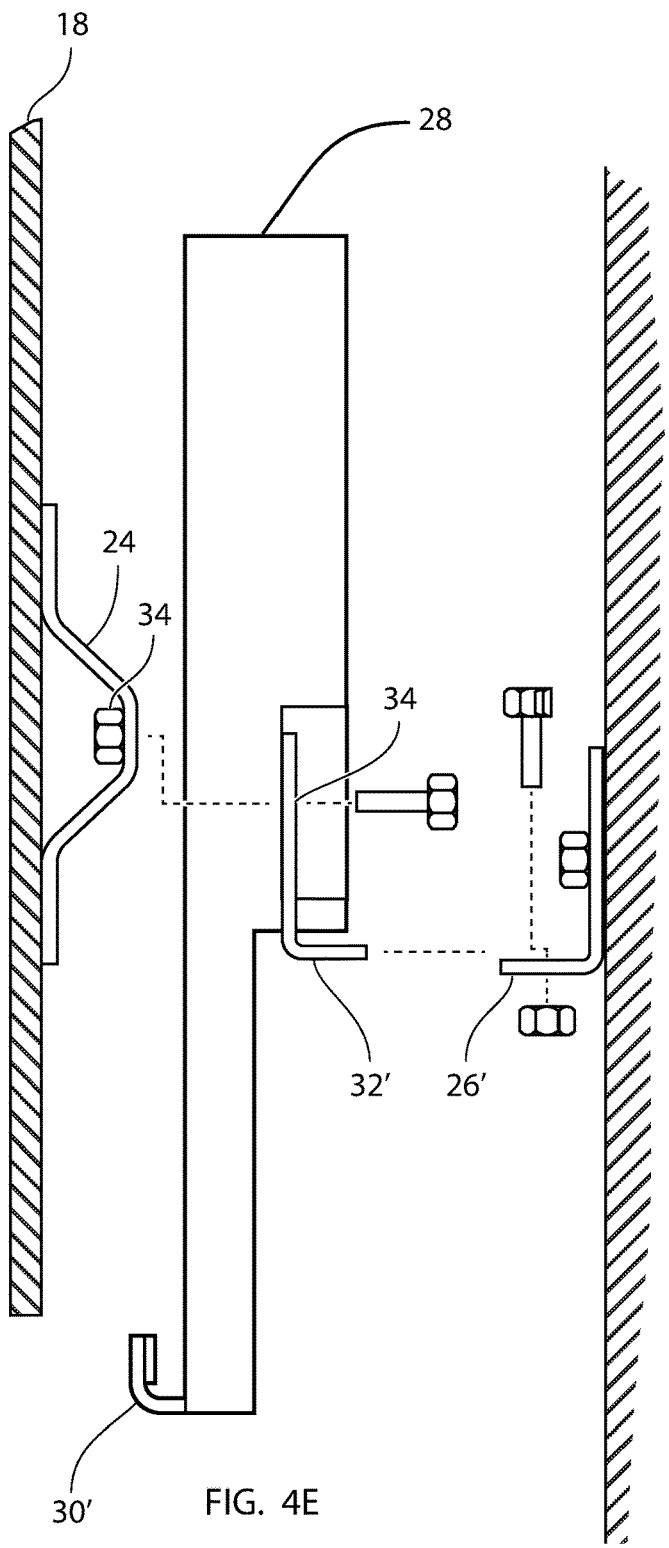
FIG. 4E is an exploded side view of a lower mounting system for a solar module.
Figure 4F:
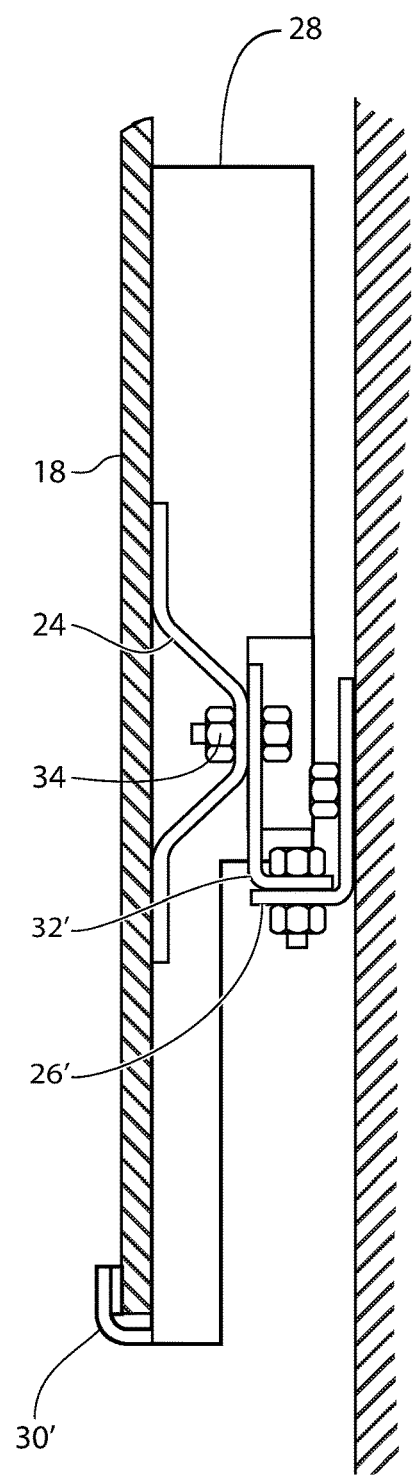
FIG. 4F is a side view of the lower mounting system of FIG. 4E when mounted.

FIG. 4E is an exploded side view of a lower mounting system for a solar module. The lower mounting system may advantageously be similar in construction to the above-described upper and middle mounting systems. In the lower mounting system, however, a frame 30' forms the lower part of the outer frame of the module. A rail 26' is fixed to the connecting member 28 via a screw mount 34. FIG. 4F shows a side view of a lower mounting system when mounted on the wall of a building.

Figure 5A:
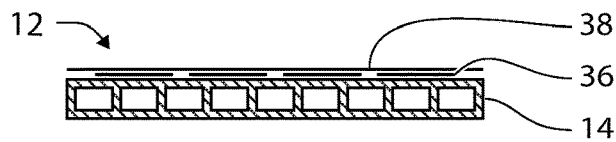
FIG. 5A is a cross-sectional view of a solar module having a load-bearing sandwich structure.
Figure 5B:
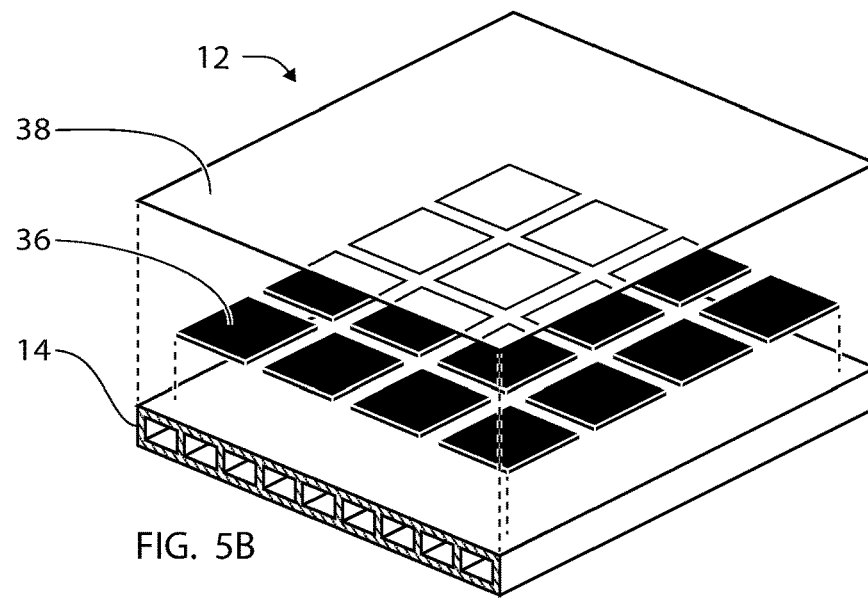
FIG. 5B is a perspective view of the solar module having a load-bearing sandwich structure.

FIGS. 5A and 5B show a solar module 12 having a load-bearing sandwich structure 14. The solar module 12 further comprises photovoltaic cells 36, which are laminated onto the sandwich structure 14 by the use of e.g. glue or EVA. The photovoltaic cells 36 are protected by a thin layer or foil 38 of a transparent plastic material.

Figure 6A:
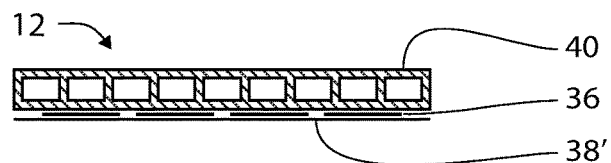
FIG. 6A is a cross-sectional view of a solar module having a sandwich structure as a cover.
Figure 6B:
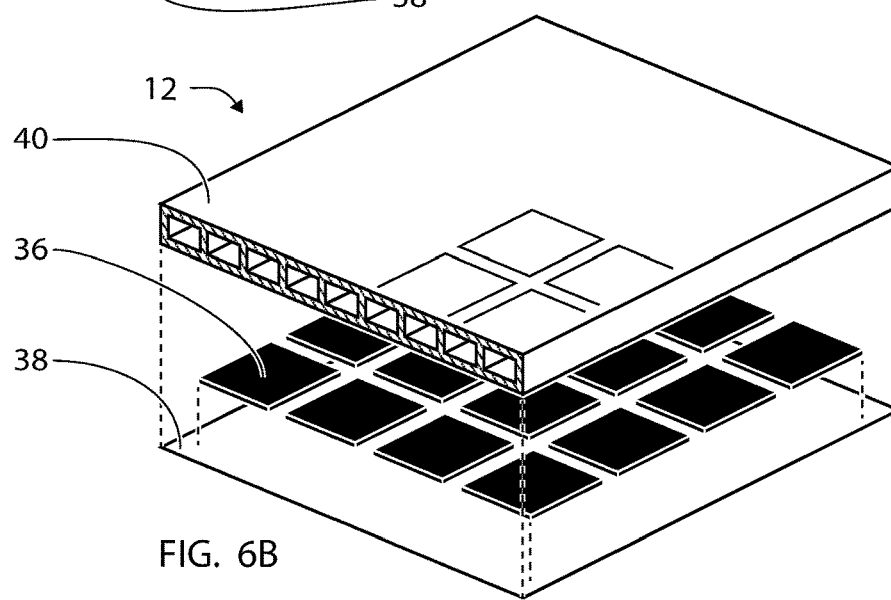
FIG. 6B is a perspective view of the solar module having a sandwich structure as a cover.

FIGS. 6A and 6B show a solar module 12 having a transparent cover 40 provided by a sandwich structure. The sandwich structure that forms the cover 40 may be load-bearing, and it may also be used for providing thermal insulation to the solar module 12. Aluminum cannot be used, as it is opaque, and thus glass or plastic are feasible materials. A backing plate 38' is, in the present embodiment, made of a foil or plate material, such as plastic or metal.

Figure 7A:
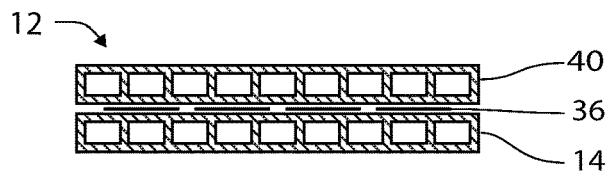
FIG. 7A is a cross-sectional view of a solar module with a sandwich structure as a cover and having load-bearing capabilities.
Figure 7B:
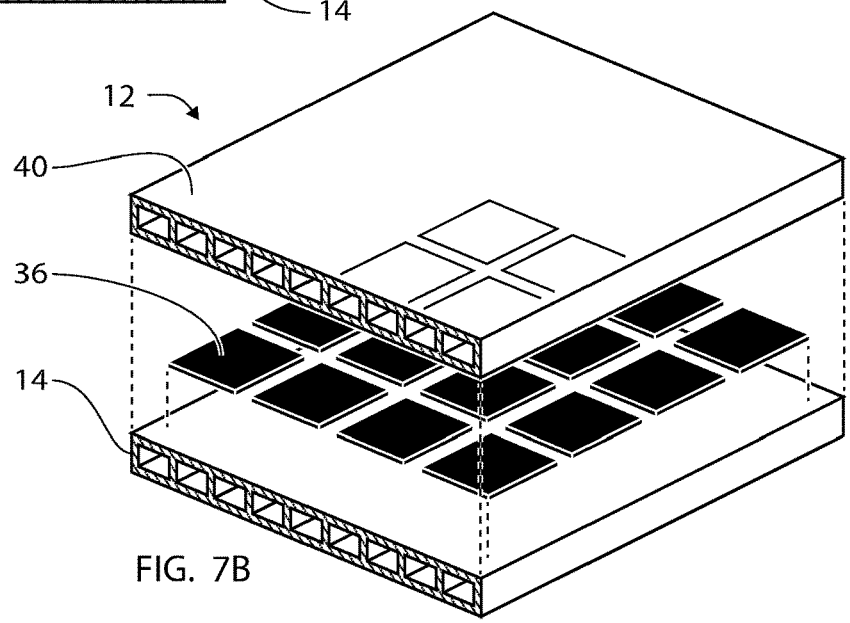
FIG. 7B is a perspective view of the solar module with a sandwich structure as cover and having load-bearing capabilities.

FIGS. 7A and 7B show a solar module 12 with a cover 40 formed as a sandwich structure, and a loadbearing sandwich structure 14 made of, e.g., aluminum located on the opposite side, whereby the photovoltaic cells 36 are located in-between the cover 40 and the load-bearing sandwich structure 14.

Figure 8A:
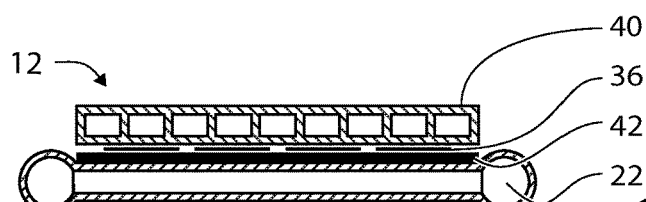
FIG. 8A is a cross-sectional view of a solar module having a sandwich structure and a thermal absorber.
Figure 8B:
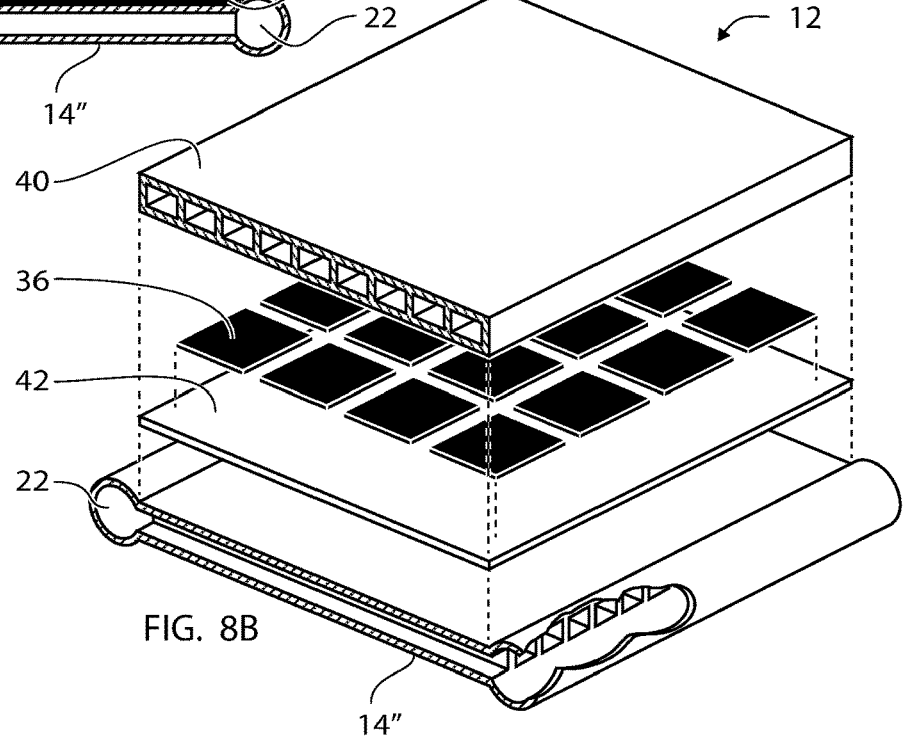
FIG. 8B is a perspective view of the solar module having a sandwich structure and a thermal absorber.

FIGS. 8A and 8B show a solar module 12 having a sandwich structure 14 and thermal absorber 42. It should hereby be noted that the thermal absorber 42 is preferably not be a separate part. Thus, it may be omitted. Alternatively, it may be integrated into the sandwich structure 14. The thermal absorber 42 and the sandwich structure 14 may thus form a unitary element. The thermal absorber preferably has a black color in order to efficiently absorb heat energy. A heating (or cooling) fluid such as water or glycol is thereby circulated through the cells of the inner structure of the sandwich structure 14, between the upper plate and the lower plate. The cells of the sandwich structure 14 are connected to a respective inlet and outlet manifold or pipe 22, whereby the fluid heats up (or cools down) a few degrees centigrade by passing though the cells of the sandwich structure 14. The temperature of the circulating fluid may vary depending on the actual application, and temperatures between −5 degrees centigrade and 90 degrees centigrade are feasible. A normal value would be about 25 degrees centigrade. The fluid may also contribute to the cooling of the photovoltaic modules 36. The optional cover 40 of a transparent sandwich material may be used to reduce thermal losses. The pipe 22 is here made circular in cross-section; it may, however, also be square, rectangular or any other appropriate shape.

Figure 9A:
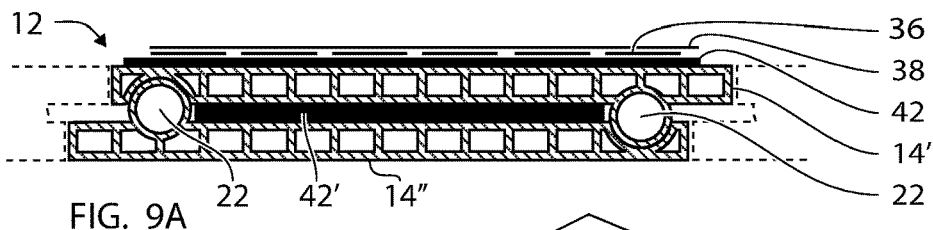
FIG. 9A is a cross-sectional view of a solar module having a staggered sandwich structure.
Figure 9B:
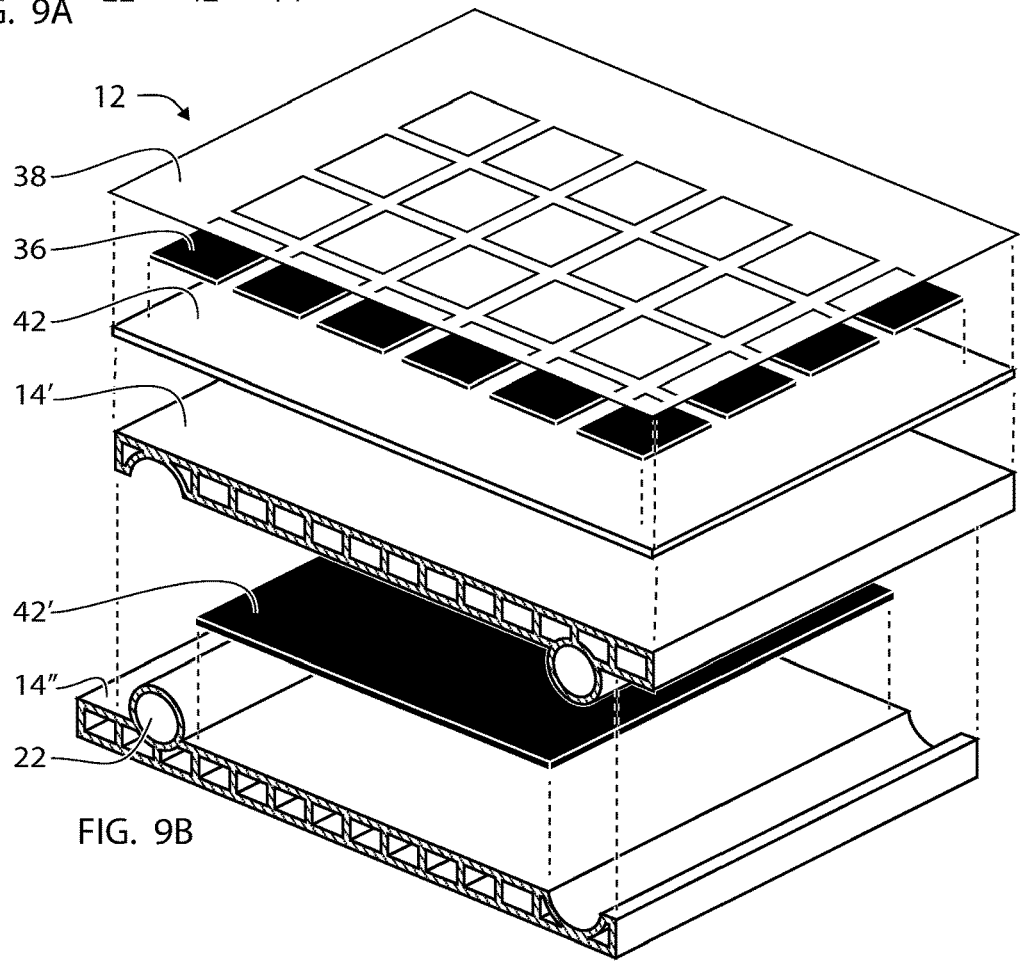
FIG. 9B is a perspective view of the solar module having a staggered sandwich structure.

FIGS. 9A and 9B show a solar module 12 having a staggered sandwich structure 14' 14". The staggered sandwich structure comprises an upper sandwich structure 14' and a lower sandwich structure 14" which are adhered together in a partially overlapping and partially non-overlapping structure.

Figure 9C:
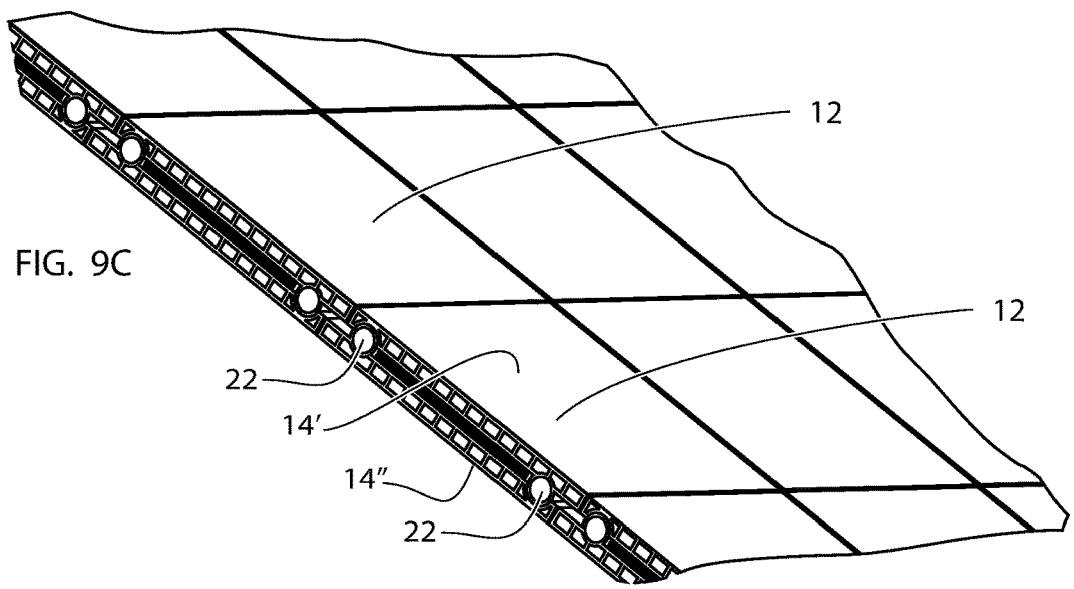
FIG. 9C is a perspective view of a roof made of solar modules.

FIG. 9C shows a perspective view of a portion of a roof made of the abovementioned solar modules 12 having staggered upper and lower sandwich structures 14', 14", respectively. The solar modules 12 may thereby be placed as roof tiles, such that the part of each sandwich structure where the upper sandwich structure 14' and the lower sandwich structure 14" are not overlapping themselves, but instead are overlapping a part of a sandwich structure of an adjacent solar module. In this way, the roof may be made fully rain proof, similar to conventional roof tiles. Additionally, the modules 12 may be sealed together forming a fully waterproof surface.

Figure 10:
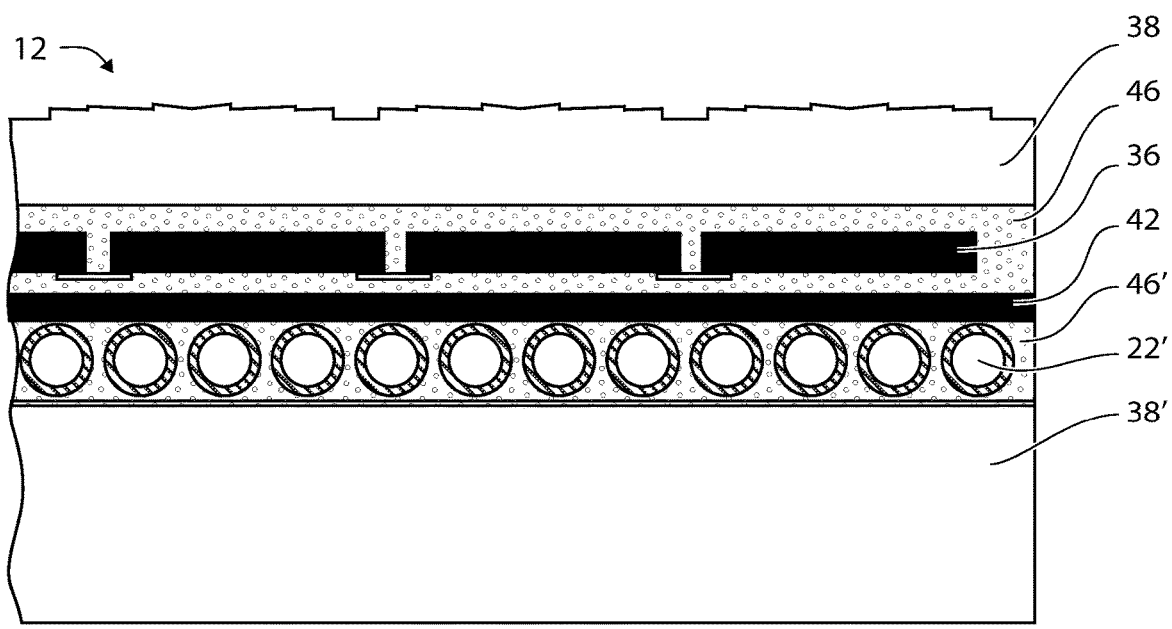
FIG. 10 is a cross-sectional view of a solar module having a copper absorber.

FIG. 10 shows a cross-sectional view of a solar module 12 having metal absorbers 46, 46' above and below, respectively, and a thermal absorber 42, preferably of a type described above. In this embodiment, the metal absorbers 46, 46' are copper. Copper absorbers have conventionally been used together with copper pipes 22' for collecting thermal energy. Copper has a superior thermal conductivity. The photovoltaic cells 36 are encapsulated in EVA.

Figure 11:
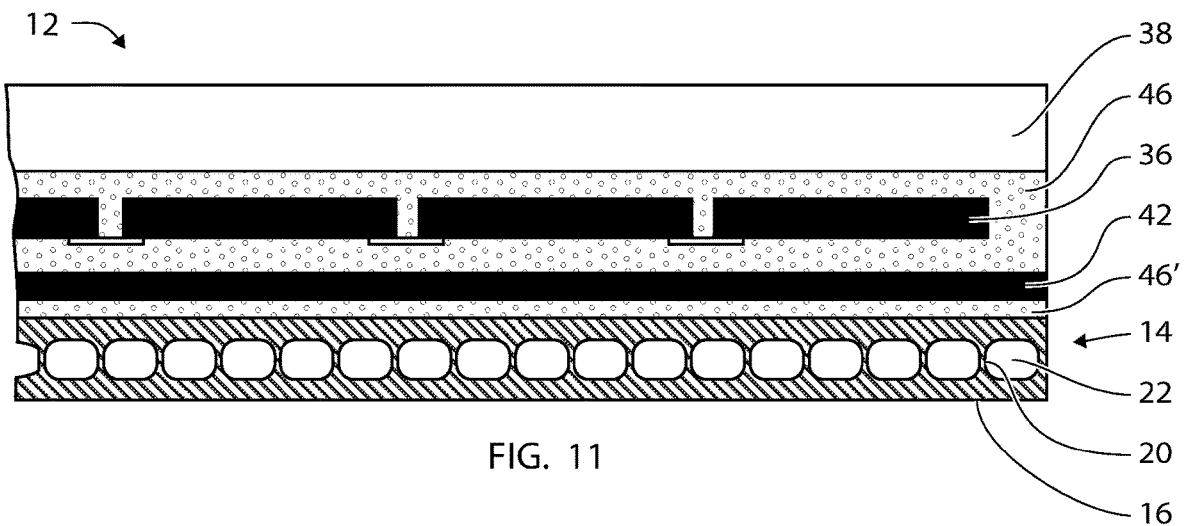
FIG. 11 is a cross-sectional view of a solar module having an aluminium absorber.

FIG. 11 shows a cross-sectional view of a solar module 12 in which the metal absorbers 46, 46' are aluminum. Aluminum also has a very high thermal conductivity and is easier to extrude into a sandwich structure 14. The advantage of this embodiment is that the sandwich structure 14 is a structurally load-bearing element, while it also includes fluid channels 22 for transporting heat-absorbing fluid. The photovoltaic cells 36 are encapsulated in EVA.

Figure 12:
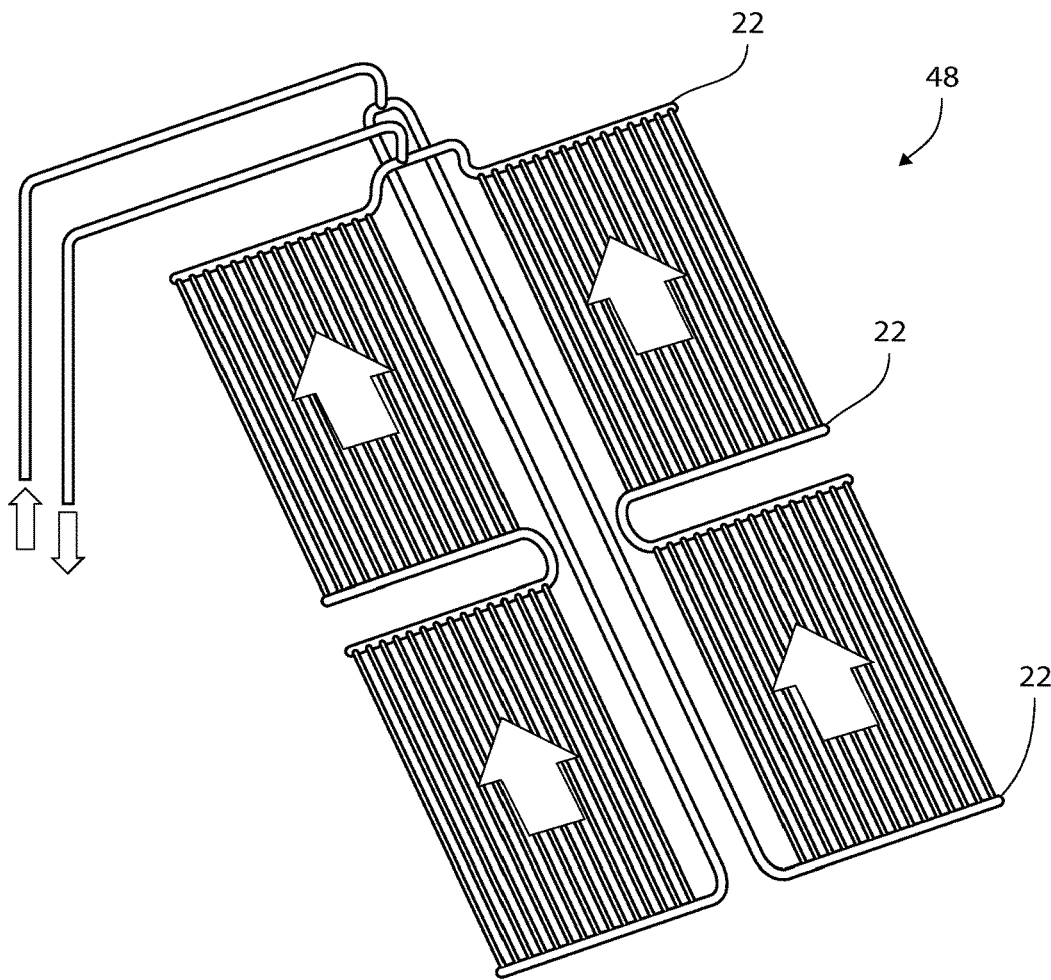
FIG. 12 is a perspective view of a piping system.

FIG. 12 shows a piping system 48 that may advantageously be used with the solar modules 12. Manifolds or pipes 22 feed each of the solar modules with fluid. The fluid flows through each solar module in the cells of the sandwich structure and is then returned for collecting the heat energy thereby obtained.

Figure 13:
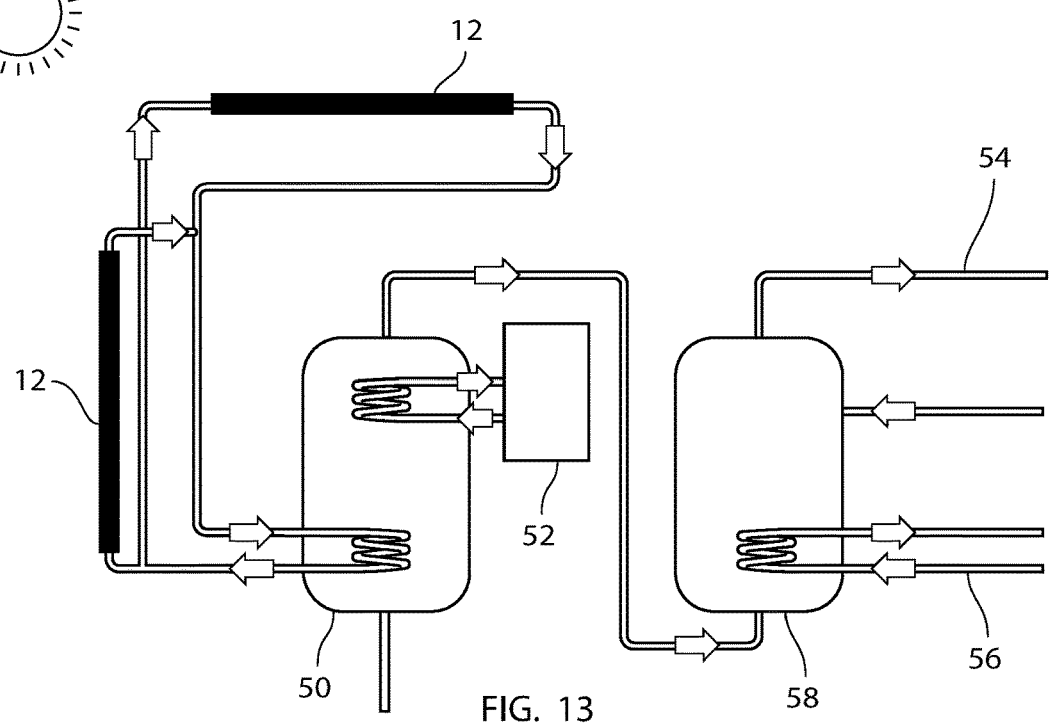
FIG. 13 is a semi-schematic view of a heating system having a heat exchanger.

FIG. 13 shows one type of heating system that may advantageously be used with the solar modules 12. This type of heating system uses a heat exchanger 50. A fluid such as water or glycol is fed through the solar panels 12. The heat exchanger 50 is used for collecting the thermal energy collected by the modules, which corresponds to the temperature difference between the fluid flowing into the heat exchanger 50 and the fluid flowing out of the heat exchanger 50. The heat exchanger 50 is, in turn, connected to a domestic water tank 58 of a building for heating water used for central heating or other domestic purposes. The heating water is conducted from, and returned to the domestic water tank 58 by a hot water conduit circuit 56, as is well known. (The system of FIG. 13 also shows a conventional cold water conduit circuit 54, which is incidental to this disclosure.) As the efficiency of the solar panels is improved, using temperatures of about 25 degrees centigrade compared to domestic water tanks, which normally use temperatures of about 50 degrees centigrade to avoid contamination by microorganism, an additional heater 52 may be required, such that the solar modules 12 provide a pre-heating of the water, and further heating is performed by another heating system (not shown).

Figure 14:
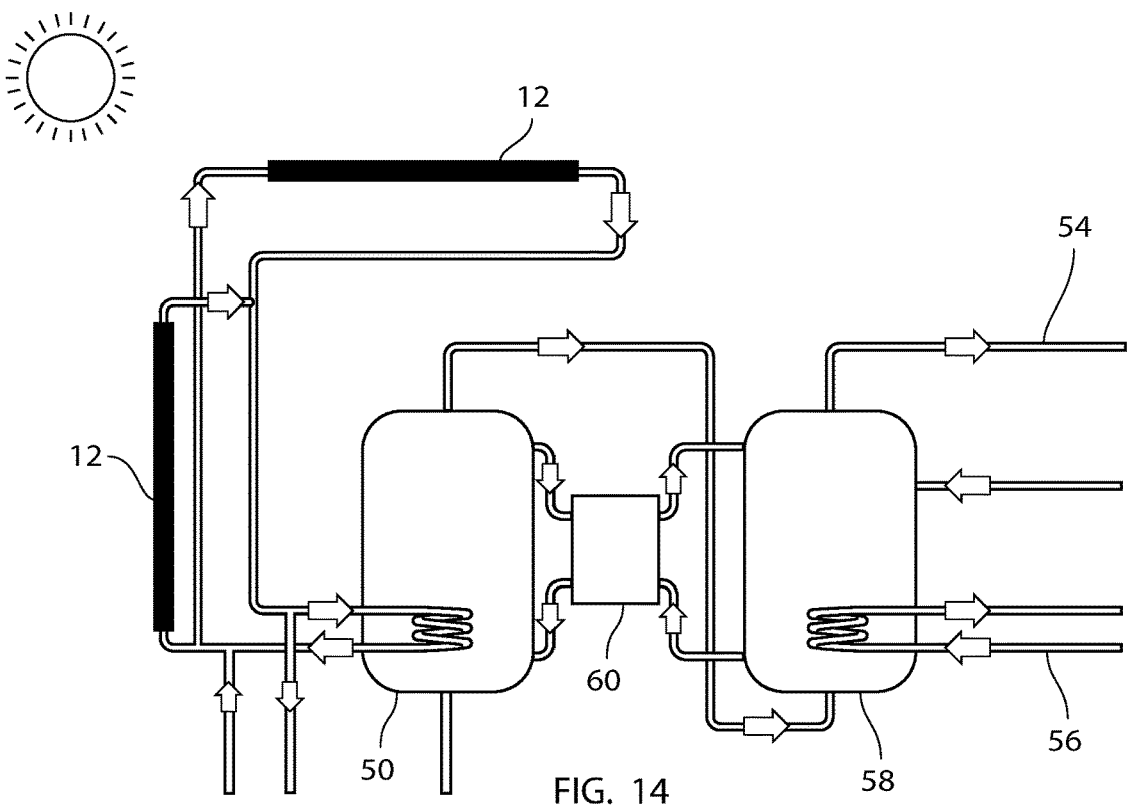
FIG. 14 is a semi-schematic view of a heating system having a heat pump.

FIG. 14 shows a perspective view of another type of heating system, which instead of using an additional heater, uses a heat pump 60 for raising the temperature of the circulating fluid from about 25 degrees centigrade, which is suitable for obtaining solar heat and cool the photovoltaic cells, to about 50 degrees centigrade which is suitable as domestic hot water.

Figure 15:
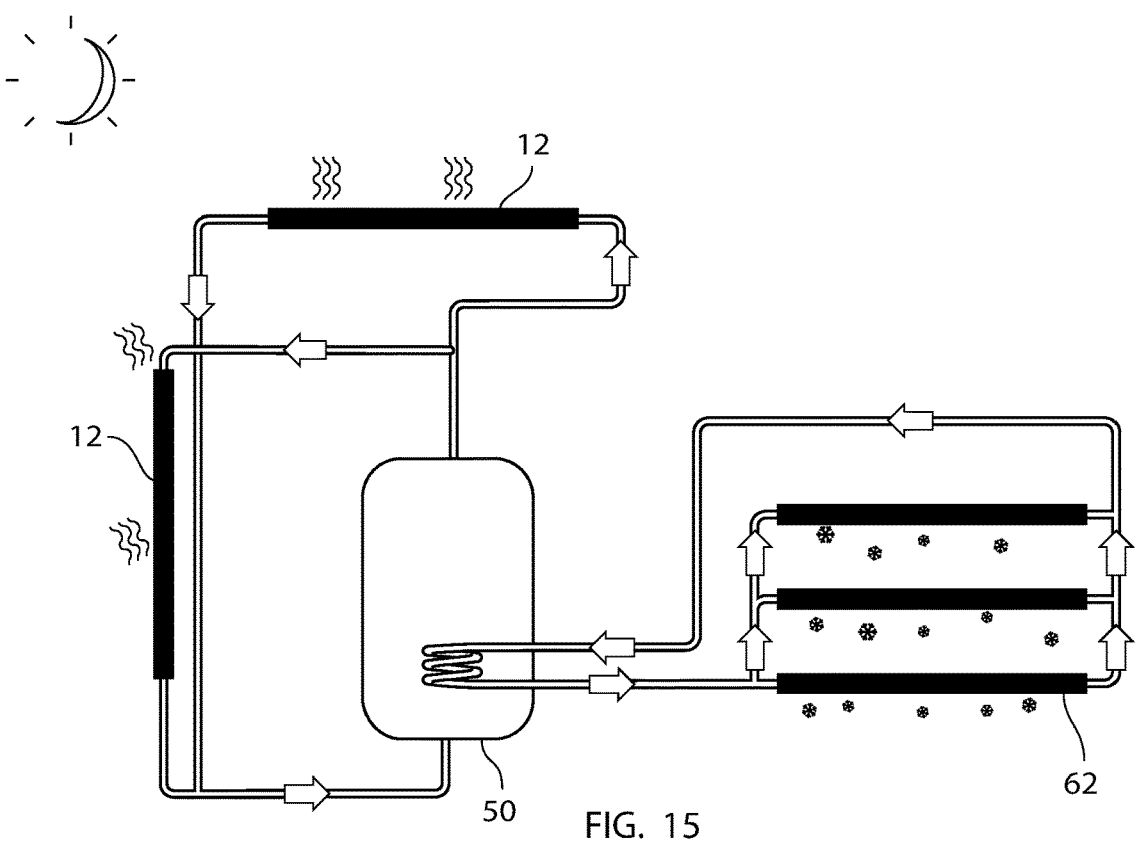
FIG. 15 is a semi-schematic view of a cooling system.

FIG. 15 shows a perspective view of a cooling system, which may be used when no incoming solar radiation exists, for obtaining night sky cooling. In this way, a fluid, such as water or glycol, is circulated through the solar modules 12, releasing heat, such that the temperature of the fluid returning from the solar modules is lower that the fluid flowing into the solar modules. The temperature difference may be collected by a heat exchanger and used in a domestic air conditioning system for providing cooling via air convectors 62.

Figure 16:
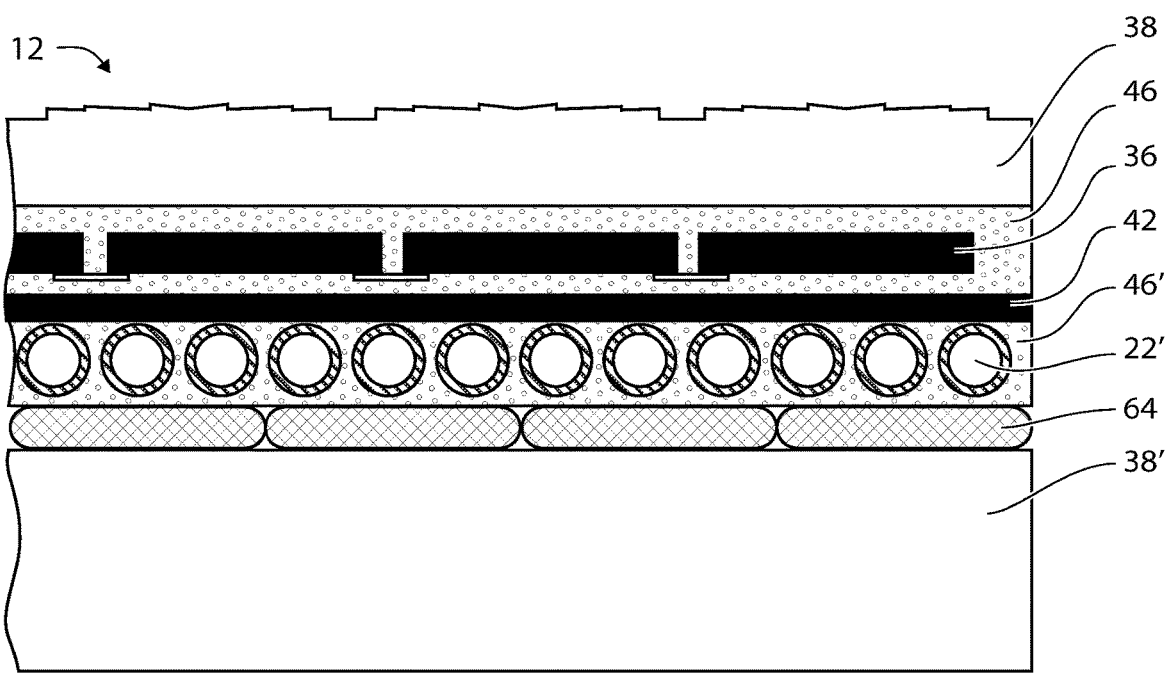
FIG. 16 is a cross-sectional view of a solar module having a copper absorber and batteries.

FIG. 16 is a cross-sectional view of a solar module 12 having an upper copper absorber 46, a lower copper absorber 46', copper pipes 22', and batteries 64. The batteries 64 are, in this embodiment, located between the lower copper absorber 46' (through which the copper pipes 22' extend) and the rear insulation layer 38'. The batteries 64 have thermal contact with the lower absorber 46' and thus indirectly to the copper pipes 22' and the photovoltaic cells 36. The batteries 64 may preferably be releasably attached to the lower absorber 46', e.g., by being clamped to the lower copper absorber 46' or in a pocket providing a tight fit and good thermal conductivity between the lower copper absorber 46' and the batteries 64. The batteries 64 may thus be easily exchanged when needed.

According to the present embodiment, the batteries 64 form an integrated part of the solar module 12 and may be electrically connected to the photovoltaic cells 36 for allowing the photovoltaic cells 36 to charge the batteries 64 during the day. The batteries 64 may be used for various purposes, including various needs of the building, such as for powering heating units, cooling units, ventilation units or other devices such as computers etc. The batteries 64 may further be used, for example, to charge electrical vehicles or light up diodes during the night as described above. The batteries 64 may be, e.g., lithium batteries.

The batteries 64 are cooled during the day by the cooling fluid circulating in the copper pipes 22' in the same way as the photovoltaic cells 36 are cooled, as described above, and the thermal energy may be collected and used for various purposes, as described above, such as building heating or domestic water heating. During the night, the batteries 64 may be directly cooled by the use of night sky cooling as described above, i.e., the radiant energy from the solar module 12 facing the night sky will yield a cooling effect on the solar module 12.

Figure 17:
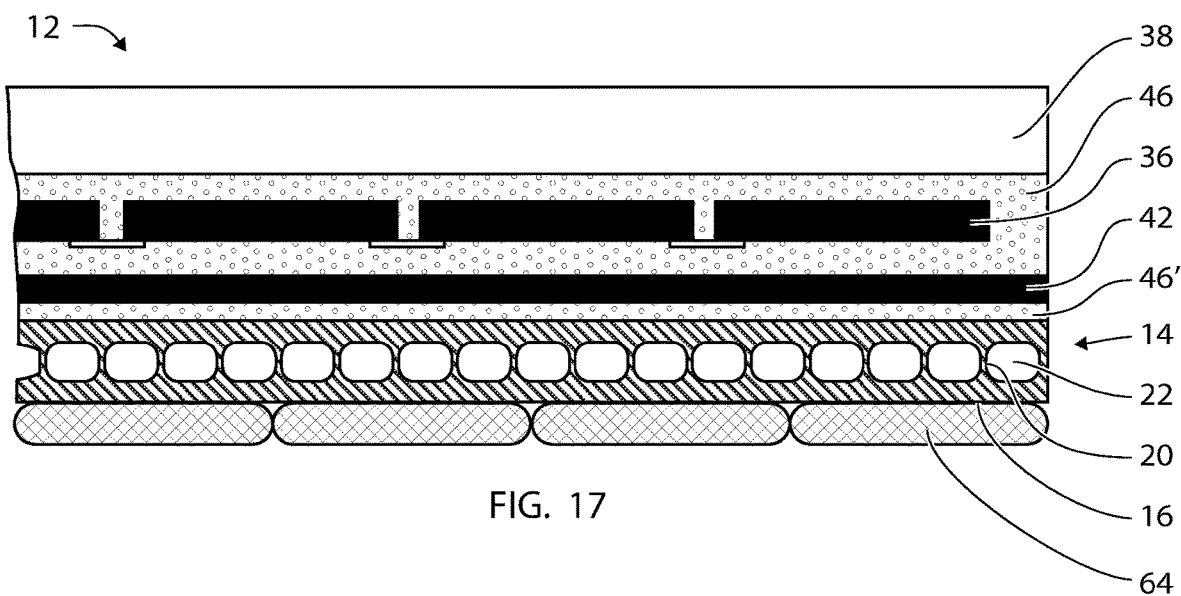
FIG. 17 is a cross-sectional view of a solar module having an aluminium absorber and batteries.

FIG. 17 is a cross-sectional view of a solar module 12 similar to the previous embodiment, in which the copper tubing is replaced by the aluminum profile 20. Thus, as previously described, the aluminum profile or structure 20 of the present embodiment provides both a structurally load-bearing element, and fluid channels 22 for transporting the absorbed heat via a heat-conducting fluid. The batteries 64 are placed in thermal contact with the aluminum profile 20. Cooling/heating liquid may be circulated through the channels 22.

Figure 18:
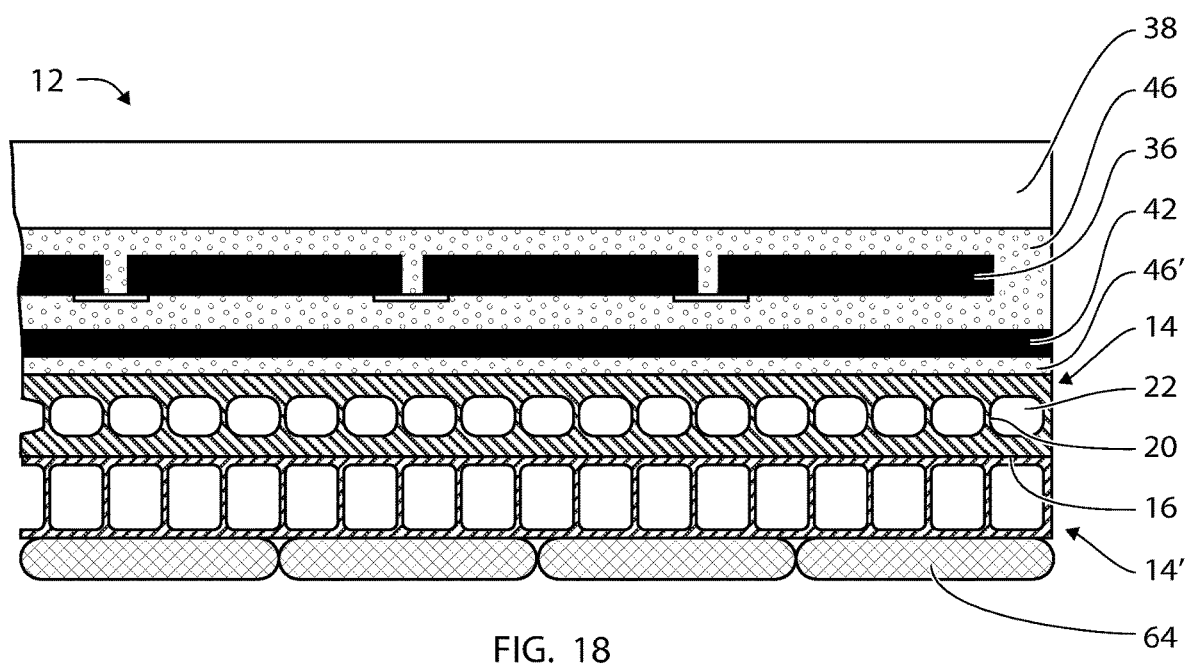
FIG. 18 is a cross-sectional view of a solar module having an aluminium absorber, a sandwich structure, and batteries.

FIG. 18 is a cross-sectional view of a solar module 12 having an aluminum absorber 20, a lower sandwich structure 14' and batteries 64. Between the aluminum heat absorber 20 and the batteries 64 a reinforcing lower sandwich structure 14' made of heat conductive material, such as a suitable metal. In this way, the solar module 12 may be fastened to a load-bearing structure without interfering with the aluminum absorber 20. Combinations of the above mentioned embodiments are of course equally feasible.

REFERENCE NUMERALS USED IN THE FIGURES

10. Building
12. Solar module
14. Sandwich structure
16. Top plate
18. Bottom plate
20. Inner material
22. Pipe
24. Profile
26. Rail
28. Connecting member
30. Frame
32. Holding part
34. Screw mount
36. Photovoltaic cells
38, 38'. Foil layers
40. Cover
42. Thermal absorber
44. Insulation
46. EVA
48. Pipe system
50. Heat exchanger
52. Heater
54. Domestic hot water
56. Central heating
58. Domestic boiler
60. Heat pump
62. Cooling convector
64. Battery

The invention claimed is:

1. A structural building element configured as a solar module, the structural building element comprising:
a load-bearing first open-cell structure comprising an upper plate having an upper surface and a bottom plate physically connected to the upper plate by a first open-cell element;
a plurality of photovoltaic cells fixed to the upper surface of the upper plate of the first open-cell structure; and
a transparent cover disposed on the upper surface of the upper plate so as to cover the plurality of photovoltaic cells, the transparent cover comprising a second open-cell structure comprising a lower plate physically connected to a top plate by a second open-cell element, wherein the plurality of photovoltaic cells are disposed between the load-bearing first open-cell structure and the transparent cover.

2. The structural building element of claim 1, wherein the first open-cell element is selected from the group consisting of one or more of a corrugated metal core, a sinusoidal-corrugated plate, and a trapezoidal-corrugated plate.

3. The structural building element of claim 1, wherein the transparent cover comprises a thermally-insulative material.

4. The structural building element of claim 1, wherein the transparent cover has at least one property selected from the group consisting of textured, self-cleaning, anti-reflective, and nano-colored.

5. The structural building element of claim 1, wherein the plurality of photovoltaic cells are disposed in a lamination layer fixed to the upper surface of the upper plate of the first open-cell structure, and wherein a plurality of bypass diodes are disposed in the lamination layer in operative connection with the plurality of photovoltaic cells.

6. The structural building element of claim 1, further comprising a thermal absorber located between the first open-cell structure and the transparent cover.

7. The structural building element of claim 1, further comprising an array of programmable Light Emitting Diodes on the upper surface of the upper plate of the first open-cell structure, wherein the array of programmable Light Emitting Diodes comprises a plurality of sets of RGB diodes.

8. The structural building element of claim 1, wherein the bottom plate of the first open-cell structure defines a bottom surface, and wherein the structural building element further comprises an insulation layer on the bottom surface of the bottom plate.

9. The structural building element of claim 1, wherein the first open-cell structure includes a portion configured for battery storage.

10. The structural building element of claim 1, further comprising a heat transfer fluid conduit disposed in the first open-cell structure.

11. The structural building element of claim 9, further comprising a battery disposed in the portion of the first open-cell structure configured for battery storage, wherein the battery is in thermal contact with the bottom plate of the first open-cell structure.

12. A structural building element configured as a solar module, the structural building element comprising:
a load-bearing first open-cell structure comprising an upper plate having an upper surface and a bottom plate physically connected to the upper plate by a first open-cell element;
a load-bearing second open-cell structure disposed on the upper plate of the first open-cell structure and comprising a lower plate and a top plate physically connected to the lower plate by a second open-cell structural element;
a first thermal absorber element disposed between the upper plate of the first open-cell structure and the lower plate of the second open-cell structure;
a second thermal absorber element disposed on the top plate of the second open-cell structure;

a plurality of photovoltaic cells fixed to the second thermal absorber element; and a transparent cover covering the plurality of photovoltaic cells, wherein the first open-cell structure and the second open-cell structure are laterally staggered relative to each other in a partially overlapping configuration.

13. The structural building element of claim 12, wherein at least one of the first and second open-cell elements is selected from the group consisting of one or more of a corrugated metal core, a sinusoidal-corrugated plate, and a trapezoidal-corrugated plate.

14. The structural building element of claim 12, wherein the transparent cover comprises a thermally-insulative material.

15. The structural building element of claim 12, wherein the transparent cover has at least one property selected from the group consisting of textured, self-cleaning, anti-reflective, and nano-colored.

16. The structural building element of claim 12, further comprising a plurality of bypass diodes operatively connected to the plurality of photovoltaic cells.

17. The structural building element of claim 12, further comprising a heat transfer fluid conduit disposed in the first open-cell structure.

18. A method of manufacturing a structural building element configured as a solar module, the method comprising:
 (a) physically connecting a first structural metal plate to a second structural metal plate with a first open-cell structural element so as to form a load-bearing sandwich structure defining a top surface on the first structural metal plate;
 (b) laminating a plurality of photovoltaic cells onto the top surface of the first structural metal plate; and
 (c) covering the plurality of photovoltaic cells with a transparent cover, wherein the transparent cover comprising a lower plate physically connected to an upper plate by a second open-cell structural element, so that the plurality of photovoltaic cells are disposed between the first structural metal plate and the transparent cover.

19. The method of claim 18, wherein the first open-cell structural element is selected from the group consisting of one or more of a corrugated metal core, a sinusoidal-corrugated plate, and a trapezoidal-corrugated plate.

20. The method of claim 18, wherein the step (b) of laminating includes the steps of:
 (b)(1) placing a thermally-absorbing element on the top surface of the first structural metal plate; and
 (b)(2) laminating the plurality of photovoltaic cells onto the thermally-absorbing element.

\* \* \* \* \*